US012309990B2

(12) United States Patent
Kao et al.

(10) Patent No.: US 12,309,990 B2
(45) Date of Patent: May 20, 2025

(54) DATA BACKUP UNIT FOR STATIC RANDOM-ACCESS MEMORY DEVICE

(71) Applicant: Taiwan Semiconductor Manufacturing Company, Ltd., Hsinchu (TW)

(72) Inventors: Yun-Feng Kao, New Taipei (TW); Katherine H. Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 411 days.

(21) Appl. No.: 17/694,974

(22) Filed: Mar. 15, 2022

(65) Prior Publication Data

US 2023/0301052 A1 Sep. 21, 2023

(51) Int. Cl.
*G11C 5/06* (2006.01)
*G11C 14/00* (2006.01)
(Continued)

(52) U.S. Cl.
CPC ............. *H10B 10/18* (2023.02); *G11C 5/063* (2013.01); *G11C 14/0072* (2013.01);
(Continued)

(58) Field of Classification Search
CPC ........ H10B 10/18; H10B 10/12; H10B 51/30; H10B 51/40; G11C 5/063; G11C 14/0072;
(Continued)

(56) References Cited

U.S. PATENT DOCUMENTS

2012/0213027 A1 8/2012 Allan et al.
2016/0163840 A1* 6/2016 Lee ................... H01L 29/66742
257/105
(Continued)

OTHER PUBLICATIONS

Semiconductor Device, Comprises Semiconductor Substrate Comprising Semiconductor Material, First Transistor Of First Polarity That Comprises First Gate Structure Comprising First Gate Electrode On First Gate Dielectric Over Semiconductor Material ; Year: 2022 (Year: 2022).*

*Primary Examiner* — Sultana Begum
(74) *Attorney, Agent, or Firm* — Eschweiler & Potashnik, LLC

(57) ABSTRACT

Various embodiments of the present application are directed towards a memory device including a memory cell. The memory cell includes a plurality of semiconductor devices disposed on a substrate. A lower inter-metal dielectric (IMD) structure overlies the semiconductor devices. A plurality of conductive vias and a plurality of conductive wires are disposed within the IMD structure and are electrically coupled to the semiconductor devices. A data backup unit overlies the plurality of conductive vias and wires. The data backup unit includes a first source/drain structure, a second source/drain structure, a channel layer, a first memory gate structure, and a second memory gate structure. The first and second memory gate structures include an upper gate electrode over a ferroelectric layer. The first and second source/drain structures are directly electrically coupled to the semiconductor devices by way of the conductive vias and wires.

20 Claims, 14 Drawing Sheets

(51) Int. Cl.
  *H10B 10/00*  (2023.01)
  *H10B 51/30*  (2023.01)
  *H10B 51/40*  (2023.01)
  *H10D 64/01*  (2025.01)
  *H10D 64/68*  (2025.01)
  *H10D 64/23*  (2025.01)

(52) U.S. Cl.
  CPC ............ *H10B 10/12* (2023.02); *H10B 51/30* (2023.02); *H10B 51/40* (2023.02); *H10D 64/033* (2025.01); *H10D 64/689* (2025.01); *H10D 64/258* (2025.01)

(58) Field of Classification Search
  CPC ............ G11C 11/412; H01L 29/40111; H01L 29/516; H01L 29/41775
  See application file for complete search history.

(56) References Cited

U.S. PATENT DOCUMENTS

| | | | |
|---|---|---|---|
| 2019/0198676 A1* | 6/2019 | Hsieh | ................ H01L 29/78 |
| 2020/0091306 A1* | 3/2020 | Heo | ................ H01L 29/1606 |
| 2021/0175238 A1 | 6/2021 | Doyle et al. | |
| 2021/0408117 A1 | 12/2021 | Wu et al. | |
| 2022/0189954 A1* | 6/2022 | Nandakumar | ...... H01L 29/0847 |
| 2024/0006507 A1* | 1/2024 | Lu | ................ H01L 29/41733 |

\* cited by examiner

DATA BACKUP UNIT FOR STATIC RANDOM-ACCESS MEMORY DEVICE

BACKGROUND

Many modern electronic devices contain electronic memory configured to store data. As technology advances at a rapid pace, engineers work to make memory devices smaller, yet more complex to improve and develop electronic devices that are more efficient, more reliable, and have more capabilities. Individual memory cells may comprise structures vertically stacked with one another, allowing for a greater bit density, and thus more efficient electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
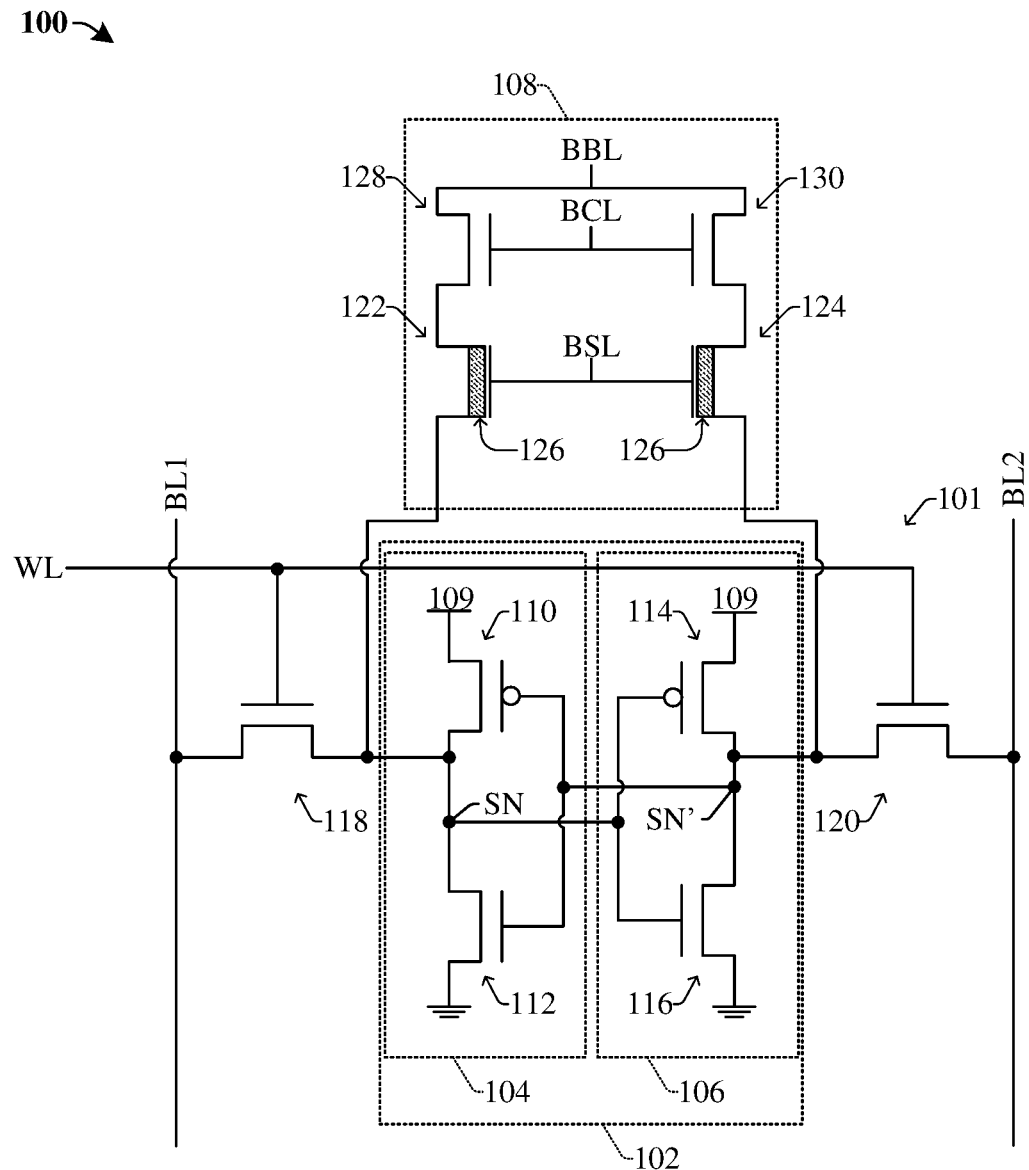
FIG. 1 illustrates a circuit diagram of some embodiments of a memory device comprising a memory cell and a data backup unit.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device may include an array of static random-access memory (SRAM) cells, where the SRAM cells of the array are arranged in a plurality of rows and a plurality of columns. An SRAM cell may include a data storage element (e.g., made up of two cross-coupled inverters) comprising four transistors (e.g., four metal oxide semiconductor field effect transistors (MOSFETs)) and at least two access transistors coupled to the data storage element to facilitate read and write operations on the SRAM cell. By virtue of the data storage element comprising the four MOSFETs, a data state of the data storage element is lost when power is removed from the SRAM cell. Accordingly, each SRAM cell further comprises a data backup unit coupled to output terminals of the data storage element and configured to store the data state of the data storage element before removing power from the memory device. This facilitates the memory device being configured as non-volatile memory. Further, the transistors of the SRAM cell are disposed in a front-end of line (FEOL) structure on/within a substrate and are formed during a FEOL process.

The data backup unit may be configured in a number of different ways. For example, the data backup unit may comprise backup access transistors and at least two non-volatile memory cells (e.g., resistive random-access memory (RRAM), magnetoresistive random access memory (MRAM), etc.) coupled between the output terminals of the data storage element and a control line. However, in such configurations the backup access transistors are disposed in the FEOL substrate, thereby increasing a footprint of the SRAM cell, and a relatively long time is used to clear data in the nonvolatile memory cells after restoring data to the SRAM cell. Alternatively, the data backup unit may comprise at least two ferroelectric transistors for storing data and at least two MOSFETS for performing backup and restore operations. However, the ferroelectric transistors and the MOSFETs are disposed on the substrate and in the FEOL structure, thereby increasing a footprint of the SRAM cell and decreasing a device density.

Accordingly, various embodiments of the present application are directed towards a memory device comprising a memory cell (e.g., a SRAM cell) coupled to a data backup unit configured to increase a speed of restoring data to the memory cell without increasing a footprint on the substrate. In some embodiments, the memory device includes a memory cell having a data storage element and two access transistors, where the data storage element comprises four transistors. The six transistors of the memory cell are disposed on a substrate in a FEOL structure. A data backup unit is coupled to outputs of the data storage element and is configured to store/restore data from/to the data storage element when power is removed or restored to the memory cell.

The data backup unit comprises a channel layer (e.g., comprising indium zinc oxide, indium tin oxide (ITO), etc.) disposed within a back-end of line (BEOL) structure overlying the FEOL structure. The data backup unit further comprises a first ferroelectric memory element, a second ferroelectric memory element, and a control device disposed on the channel layer. The first and second ferroelectric memory elements are configured to store data from the data storage element, and the control device facilitates performing read and write operations on the first and second ferroelectric memory elements. Upper gate structures of the ferroelectric memory elements are disposed along a top surface of the channel layer and a bottom gate structure of the control device is disposed along a bottom surface of the channel layer. The bottom gate structure is configured to, for example, generate electric fields that control/adjust conductivity of the channel layer and facilitates operation of the data backup unit. By virtue of the data backup unit being disposed within the BEOL structure, the memory device may have a smaller footprint and a number of memory cells disposed on a single substrate may be increased. Further, the first and second ferroelectric memory elements and control device facilitate performing fast backup and restore operations and allow for the data backup unit to be cleared while concurrently performing operations on the memory cell immediately after performing a restore operation. This, in part, increases a speed and overall performance of the memory device.

FIG. 1 illustrates a circuit diagram of some embodiments of a memory device 100 comprising a memory cell 101 and a data backup unit 108.

In some embodiments, the memory cell 101 comprises a data storage element 102 and a plurality of access devices 118, 120. The data storage element 102 comprises a first inverter 104 and a second inverter 106, which are cross-coupled to one another and establish a first data storage node SN and a second data storage node SN'. In various embodiments, the first and second data storage nodes SN, SN' are complementary such that one data storage node retains a first voltage level corresponding to a logical "1" state, while the other data storage node is biased to carry a second voltage level corresponding to a logical "0" state. Therefore, the first and second inverters 104, 106 store a bit of data in mutually reinforcing fashion. In various embodiments, the memory cell 101 is configured as a static random-access memory (SRAM) cell. In further embodiments, the data storage element 102 may be configured and/or referred to as a latch circuit.

The first inverter 104 comprises a first transistor 110 and a second transistor 112. The first transistor 110 has a first source/drain region electrically coupled to a first power supply 109 and a second source/drain region electrically coupled to the first data storage node SN. The second transistor 112 has a first source/drain region electrically coupled to the first data storage node SN and a second source/drain region electrically coupled to a reference voltage (e.g., ground). Gates of the first and second transistors 110, 112 are electrically coupled to the second data storage node SN'. The second inverter comprises a third transistor 114 and a fourth transistor 116. The third transistor 114 has a first source/drain region electrically couple to the first power supply 109 and a second source/drain region electrically coupled to the second data storage node SN'. The fourth transistor 116 has a first source/drain region electrically coupled to the second data storage node SN' and a second source/drain region electrically coupled to the reference voltage (e.g., ground). Gates of the third and fourth transistors 114, 116 are electrically coupled to the first data storage node SN. In various embodiments, the first and third transistors 110, 114 are configured as pull up transistors, and the second and fourth transistors 112, 116 are configured as pull-down transistors. The first power supply 109 may, for example, be a direct current (DC) voltage supply and/or may, for example, apply 0.7 volts, 1.8 volts, 5 volts, 12 volts, or some other suitable voltage to the first source/drain regions of the first and third transistors 110, 114.

The first, second, third, and fourth transistors 110, 112, 114, 116 may, for example, be metal-oxide-semiconductor field-effect transistors (MOSFETs), some other suitable metal-oxide-semiconductor (MOS) devices, some other suitable insulated-gate field-effect-transistors (IGFETs), fin field-effect transistors (FinFETs), gate-all-around FETs (GAAFETs), or some other suitable devices. In some embodiments, the first and third transistors 110, 114 are p-channel transistors (e.g., p-channel MOSFETs) and the second and fourth transistors 112, 116 are n-channel transistors (e.g., n-channel MOSFETs).

In further embodiments, the memory cell 101 further comprises a plurality of access transistors 118, 120 that are configured to selectively electrically couple the first and second data storage nodes SN, SN' to bit lines BL1, BL2. A first access transistor 118 has a first source/drain region electrically coupled to the first data storage node SN and a second source/drain region electrically coupled to a first bit line BL1. A second access transistor 120 has a first source/drain region electrically coupled to the second data storage node SN' and a second source/drain region electrically coupled to a second bit line BL2. Gates of the first and second access transistors 118, 120 are electrically coupled to a word line WL. In various embodiments, by applying suitable bias conditions to the access transistors 118, 120, the word line WL, and bit lines BL1, BL2, read and write operations may be performed on the memory cell 101. In some embodiments, the first and second access transistors 118, 120 are n-channel transistors (e.g., n-channel MOSFETS) and may be referred to as pass-gate transistors. In yet further embodiments, the first and second access transistors 118, 120 may, for example, be MOSFETs, some other suitable MOS devices, some other suitable IGFETs, FinFETs, GAAFETs, or some other suitable devices.

The data backup unit 108 is electrically coupled to the first and second data storage nodes SN, SN' and is configured to store/restore data from/to the data storage element 102 when power is removed or restored to the memory cell 101. For example, the data backup unit 108 may store a data state of the memory cell 101 before removing power from the memory cell 101 (or before placing the memory cell 101 into a standby state) and may restore the data state to the memory cell 101 after returning power to the memory cell 101 (or after leaving the standby state).

In various embodiments, the data backup unit 108 comprises a first ferroelectric memory element 122, a second ferroelectric memory element 124, and control switching devices 128, 130. In some embodiments, the first and second ferroelectric memory elements 122, 124 comprise a ferroelectric layer 126 that is configured to store the data state of the data storage element 102. In various embodiments, the first and second ferroelectric memory elements 122, 124 may be configured as ferroelectric transistors. The first ferroelectric memory element 122 comprises a first source/drain terminal electrically coupled to the first data storage node SN, a second source/drain terminal electrically coupled to a first source/drain terminal of a first control switching device 128, and a gate structure electrically coupled to a backup select line BSL. The second ferroelectric memory element 124 comprises a first source/drain terminal electrically coupled to the second data storage node SN', a second source/drain terminal electrically coupled to a first source/ drain terminal of a second control switching device 130, and a gate structure electrically coupled to the backup select line BSL. Further, second source/drain terminals of the first and second control switching devices 128, 130 are electrically coupled to a backup bit line BBL and gates of the first and second control switching devices 128, 130 are electrically coupled to a backup control line BCL.

During operation of the memory device 100, a data storage operation may be performed to store a data state of the data storage element 102 in the first and second ferroelectric memory elements 122, 124. In such embodiments, gates of the first and second ferroelectric memory elements 122, 124 are biased by way of the backup select line BSL to set threshold voltages of the first and second ferroelectric memory elements 122, 124 based on first voltage levels at the first and second data storage nodes SN, SN'. Accordingly, the data state of the data storage element 102 may be stored or saved in the data backup unit 108 by adjusting threshold voltages of the first and second ferroelectric memory elements 122, 124. Further, a power off operation may be performed such that power is removed from the memory device 100, where the data backup unit 108 retains the data state of the data storage element 102 in the ferroelectric layers 126 of the first and second ferroelectric memory elements 122, 124 and voltages at the first and second data storage nodes SN, SN' are lost. Subsequently, a data restore operation may be performed on the memory device 100 to restore the data state to the memory cell 101. In such embodiments, suitable bias conditions are applied to the first and second ferroelectric memory elements 122, 124 and the control switching devices 128, 130 to set the first and second data storage nodes SN, SN' to the first voltage levels based on the threshold voltages of the first and second ferroelectric memory elements 122, 124. Furthermore, a data clear operation may be performed on the data backup unit 108, such that the first and second ferroelectric memory elements 122, 124 are programmed to have a high threshold voltage. In such embodiments, read and write operations may be performed on the memory cell 101 during the data clear operation, thereby increasing a speed and overall performance of the memory device 100.

Figure 2:
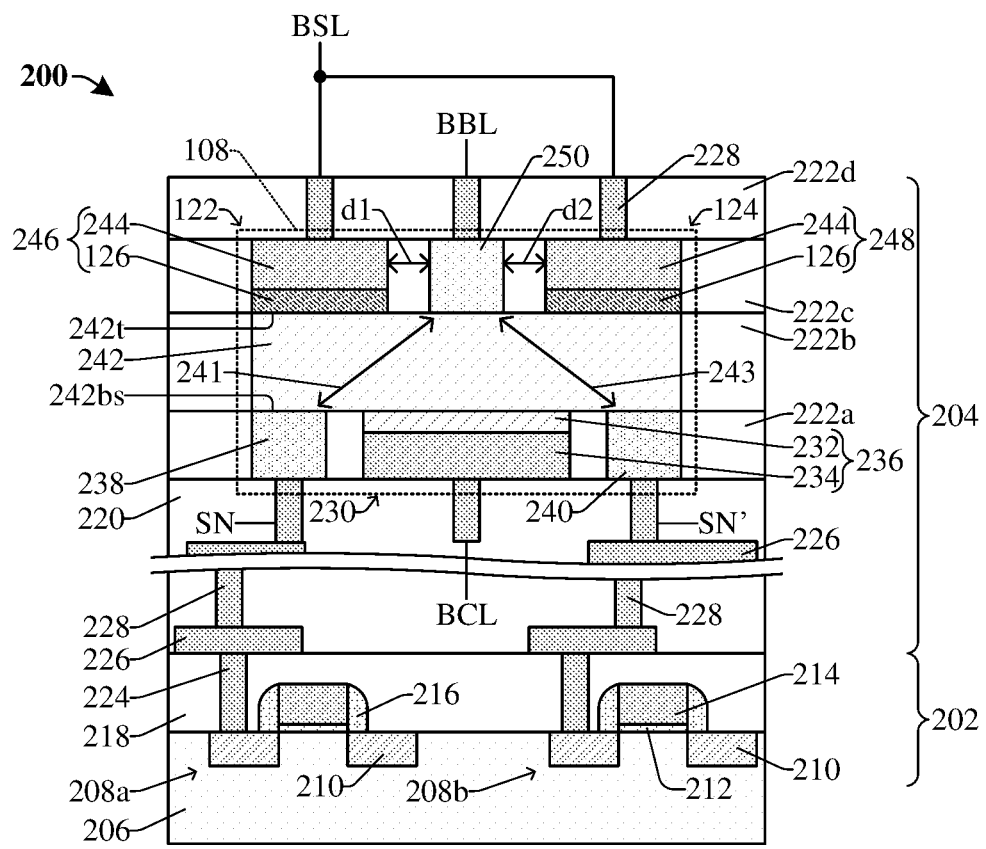
FIG. 2 illustrates a cross-sectional view of some embodiments of a memory device comprising a data backup unit overlying a substrate.

In addition, the memory cell 101 is disposed in a front-end of line (FEOL) structure that is on/within a substrate, and the data backup unit 108 is disposed within a back-end of line (BEOL) structure overlying the memory cell 101 (e.g., see FIG. 2). By virtue of the data backup unit 108 being disposed within the BEOL structure and overlying the memory cell 101, a footprint of the memory device 100 may be decreased and a number of memory cells disposed on a single substrate may be increased. This may increase a device density and allows for a greater bit density.

FIG. 2 illustrates a cross-sectional view of some embodiments of a memory device 200 comprising a data backup unit 108 overlying a substrate 206.

The memory device 200 comprises a FEOL structure 202 disposed within/on the substrate 206 and a BEOL structure 204 overlying the FEOL structure 202. The substrate 206 may, for example, be or comprise a bulk substrate (e.g., bulk silicon), a silicon-on-insulator (SOI) substrate, monocrystalline silicon, or another suitable semiconductor material. In some embodiments, the FEOL structure 202 comprises a plurality of semiconductor devices 208a-b, an inter-level dielectric (ILD) layer 218, and a plurality of conductive contacts 224. The plurality of semiconductor devices 208a-b comprises a first semiconductor device 208a and a second semiconductor device 208b. The semiconductor devices 208a-b may, for example, be configured as transistors (e.g., MOSFETs) and are disposed within/on the substrate 206. In various embodiments, the semiconductor devices 208a-b comprise a pair of source/drain regions 210 disposed within the substrate 206, a gate electrode 214 overlying the substrate 206 and spaced between the source/drain regions 210, a gate dielectric layer 212 disposed between the substrate 206 and the gate electrode 214, and sidewall spacers 216 disposed on sidewalls of the gate electrode 214 and the gate dielectric layer 212. The source/drain regions 210 may, for example, be doped regions of the substrate 206 and may have a doping type opposite that of adjacent regions of the substrate 206. The plurality of conductive contacts 224 are disposed within the ILD layer 218 and are electrically coupled to the semiconductor devices 208a-b.

The data backup unit 108 is disposed within the BEOL structure 204 and directly overlies the semiconductor devices 208a-b disposed within/on the substrate 206. In various embodiments, the BEOL structure 204 comprises a plurality of conductive wires 226, a plurality of conductive vias 228, a lower inter-metal dielectric (IMD) structure 220, and a plurality of dielectric layers 222a-d. The conductive wires and vias 226, 228 are disposed within the lower IMD structure 220 and the plurality of dielectric layers 222a-d and are configured to electrically couple the data backup unit 108 to other devices disposed over/on the substrate 206. For example, the data backup unit 108 may be electrically coupled to the semiconductor devices 208a-b by way of the conductive contacts 224, the conductive wires 226, and the conductive vias 228. The plurality of dielectric layers 222a-d comprises a first dielectric layer 222a overlying the lower IMD structure 220, a second dielectric layer 222b overlying the first dielectric layer 222a, a third dielectric layer 222c overlying the second dielectric layer 222b, and a fourth dielectric layer 222d overlying the third dielectric layer 222c.

In some embodiments, the data backup unit 108 comprises a channel layer 242, a first source/drain structure 238, a second source/drain structure 240, a third source/drain structure 250, a bottom gate structure 236, a first memory gate structure 246, and a second memory gate structure 248. The first source/drain structure 238, the second source/drain structure 240, and the bottom gate structure 236 are disposed within the first dielectric layer 222a and contact a bottom surface 242bs of the channel layer 242. The channel layer 242 is disposed within the second dielectric layer 222b. The third source/drain structure 250, the first memory gate structure 246, and the second memory gate structure 248 are disposed within the third dielectric layer 222c and contact a top surface 242t of the channel layer 242. Conductive vias 228 are disposed within the fourth dielectric layer 222d and are electrically coupled to the first and second memory gate structures 246, 248 and the third source/drain structure 250.

The bottom gate structure 236 comprises a bottom gate dielectric layer 232 disposed along the bottom surface 242bs of the channel layer 242 and a bottom gate electrode 234 disposed along the bottom gate dielectric layer 232. Further, the bottom gate structure 236 is spaced laterally between the first source/drain structure 238 and the second source/drain structure 240. In some embodiments, a top surface of the bottom gate structure 236, a top surface of the first source/drain structure 238, and a top surface of the second source/drain structure 240 are aligned with one another and/or are co-planar. The first and second memory gate structures 246, 248 comprise a ferroelectric layer 126 that contacts the top surface 242t of the channel layer 242 and an upper gate electrode 244 disposed on the ferroelectric layer 126. The third source/drain structure 250 contacts the top surface 242t of the channel layer 242 and is disposed laterally between the first and second memory gate structures 246, 248. In some embodiments, a top surface of the first memory gate structure 246, a top surface of the third source/drain structure 250, and a top surface of the second memory gate structure 248 are aligned with one another and/or are coplanar. In various embodiments, an outer sidewall of the first memory gate structure 246 is aligned with a first outer sidewall of the channel layer 242, and an outer sidewall of the second memory gate structure 248 is aligned with a second outer sidewall of the channel layer 242, where the second outer sidewall of the channel layer 242 is opposite the second outer sidewall. The first, second, and third source/drain structures 238, 240, 250 are electrically coupled to the channel layer 242.

A sidewall of the first memory gate structure 246 is laterally offset from the third source/drain structure 250 by a first distance d1, and a sidewall of the second memory gate structure 248 is laterally offset from the third source/drain structure 250 by a second distance d2. The bottom gate structure 236 directly underlies the third source/drain structure and directly underlies at least a portion of the first memory gate structure 246 and at least a portion of the second memory gate structure 248. In some embodiments, the bottom gate structure 236 directly underlies a first region of the channel layer 242 between the first memory gate structure 246 and the third source/drain structure 250, where a length of the first region is equal to the first distance d1. Further, the bottom gate structure 236 directly underlies a second region of the channel layer 242 between the second memory gate structure 248 and the third source/drain structure 250, where a length of the second region is equal to the second distance d2.

The first memory gate structure 246, the third source/drain structure 250, and the first source/drain structure 238 are parts of a first ferroelectric memory element 122, and the second memory gate structure 248, the third source/drain structure 250, and the second source/drain structure 240 are parts of a second ferroelectric memory element 124. Accordingly, the third source/drain structure 250 may be a common source/drain structure shared by the first and second ferroelectric memory elements 122, 124. In further embodiments, the first, second, and third source/drain structures 238, 240, 250 and bottom gate structure 236 are parts of a control device 230. For example, the control device 230 may comprise a first control switching device (e.g., 128 of FIG. 1) and a second control switching device (e.g., 130 of FIG. 1). In such embodiments, the first and third source/drain structures 238, 250 and bottom gate structure 236 are part of the first control switching device (e.g., 128 of FIG. 1), and the second and third source/drain structures 240, 250 and bottom gate structure 236 are part of the second control switching device (e.g., 130 of FIG. 1).

In various embodiments, the first and second ferroelectric memory elements 122, 124 are each configured to store data (e.g., a binary "0" or binary "1") based on a polarization state of the ferroelectric layer 126. For example, the ferroelectric layer 126 having a positive polarity (e.g., +Pr) may represent a binary "0", whereas the ferroelectric layer 126 having a negative polarity (e.g., −Pr) may represent a binary "1", or vice versa. In various embodiments, setting the polarization to the positive polarity may include applying a first write voltage across the ferroelectric layer 126, and setting the polarization to the negative polarity may include applying a second write voltage across the ferroelectric layer 126. For example, setting the polarization of the ferroelectric layer 126 of the first ferroelectric memory element 122 to the positive polarity may include applying the first write voltage across the ferroelectric layer 126 from the upper gate electrode 244 of the first memory gate structure 246 to the channel layer 242 (e.g., via the first and/or third source/drain structures 238, 250). In addition, setting the polarization of the ferroelectric layer 126 of the first ferroelectric memory element 122 to the negative polarity may include applying the second write voltage across the ferroelectric layer 126 from the upper gate electrode 244 of the first memory gate structure 246 to the channel layer 242 (e.g., via the first and/or third source/drain structures 238, 250). In various embodiments, the first and second write voltages have opposite polarities.

The polarity of the ferroelectric layer 126 shifts a threshold voltage of the first and second ferroelectric memory elements 122, 124. Depending on whether the polarization of the ferroelectric layer 126 is in the positive polarity or the negative polarity, the threshold voltage of the corresponding ferroelectric memory element is at a first threshold value or a second threshold value. For example, when the ferroelectric layer 126 of the first ferroelectric memory element 122 has the positive polarity the first ferroelectric memory element 122 has the first threshold value (e.g., a low threshold value), and when the ferroelectric layer 126 of the first ferroelectric memory element 122 has the negative polarity the first ferroelectric memory element 122 has the second threshold value (e.g., a high threshold value). In some embodiments, the first threshold value is less than the second threshold value, or vice versa.

In various embodiments, by applying appropriate biasing conditions to structures of the data backup unit 108, the channel layer 242 may have a first selectively conductive channel 241 extending between the first source/drain structure 238 and the third source/drain structure 250 and a second selectively conductive channel 243 extending between the second source/drain structure 240 and the third source/drain structure 250. In yet further embodiments, the bottom gate structure 236 is configured to generate an electric field in the channel layer 242 that facilitates charge carriers (e.g., electrons) flowing in the first selectively conductive channel 241 and/or the second selectively conductive channel 243 based on biasing conditions applied to the bottom gate electrode 234 and/or threshold voltages of the first and second ferroelectric memory elements 122, 124.

In various embodiments, the first source/drain structure 238 may be electrically coupled to the first data storage node SN of a memory cell (e.g., 101 of FIG. 1) and the second source/drain structure 240 may be electrically coupled to the second data storage node SN' of the memory cell (e.g., 101 of FIG. 1. Further, the bottom gate electrode 234 of the control device 230 is electrically coupled to the backup control line BCL, the upper gate electrodes 244 of the first and second ferroelectric memory elements 122, 124 are electrically coupled to the backup select line BSL, and the third source/drain structure 250 is electrically coupled to the backup bit line BBL.

In some embodiments, the semiconductor devices 208a-b may be part of the memory cell (101 of FIG. 1). For example, the first semiconductor device 208a may be configured as the first transistor (110 of FIG. 1) of the first inverter (104 of FIG. 1) and has a source/drain region that is electrically coupled to the first data storage node SN and the first source/drain structure 238. Further, the second semiconductor device 208b may be configured as the third transistor (114 of FIG. 1) of the second inverter (106 of FIG. 1) and has a source/drain region that is electrically coupled to the second data storage node SN' and the second source/ drain structure 240. Thus, in some embodiments, the six transistors of the memory cell (101 of FIG. 1) may be disposed in the FEOL structure 202 and the data backup unit 108 is disposed within the BEOL structure 204 over the devices of the memory cell (101 of FIG. 1). This vertically stacked structure facilitates the data backup unit 108 performing backup and restore operations on the memory cell (101 of FIG. 1) while reducing a lateral footprint of the memory device, thereby improving a performance of the memory cell (101 of FIG. 1) and increasing a device density of the memory device.

In various embodiments, the ILD layer 218, the lower IMD structure 220, and the plurality of dielectric layers 222a-d may, for example, be or comprise a low-k dielectric (e.g., a dielectric material with a dielectric constant less than about 3.9), an oxide (e.g., such as silicon dioxide), silicon nitride, silicon oxynitride, undoped silicate glass, undoped silicon dioxide, another dielectric material, or any combination of the foregoing. In further embodiments, the sidewall spacers 216 may, for example, be or comprise silicon nitride, silicon carbide, silicon oxycarbide, silicon oxynitride, other suitable dielectric materials, or any combination of the foregoing. In some embodiments, the gate dielectric layer 212 may, for example, be or comprise silicon dioxide, a high-k dielectric material (e.g., a dielectric material with a dielectric constant greater than about 3.9), hafnium dioxide, zirconium dioxide, another dielectric material, or any combination of the foregoing. In yet further embodiments, the gate electrode 214 may, for example, be or comprise titanium, titanium nitride, tantalum, tantalum nitride, tungsten, tungsten nitride, aluminum, polysilicon, doped polysilicon, other suitable conductive material(s), or any combination of the foregoing.

In various embodiments, the conductive contacts 224, the conductive wires 226, and/or the conductive vias 228 may, for example, be or comprise copper, aluminum, tungsten, titanium nitride, tantalum nitride, ruthenium, another conductive material, or any combination of the foregoing. In further embodiments, the first, second, and third source/drain structures 238, 240, 250 may, for example, be or comprise titanium, titanium nitride, tungsten, tungsten nitride, tantalum, tantalum nitride, platinum, gold, another conductive material, or any combination of the foregoing. In some embodiments, the channel layer 242 may, for example, be or comprise indium zinc oxide (InZnO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), zinc oxide doped with aluminum (AZO), indium tungsten oxide (IWO), titanium oxide, a group III-V semiconductor material, a stack of layers comprising any of the aforementioned materials, an alloy, another suitable material, or any combination of the foregoing.

In yet further embodiments, the bottom gate electrode 234 and/or upper gate electrode 244 may, for example, be or comprise titanium, titanium nitride, tantalum, tantalum nitride, tungsten, tungsten nitride, aluminum, polysilicon, doped polysilicon, other suitable conductive material(s), or any combination of the foregoing. In some embodiments, the bottom gate dielectric layer 232 may, for example, be or comprise silicon dioxide, a high-k dielectric material (e.g., a dielectric material with a dielectric constant greater than about 3.9), hafnium dioxide, zirconium dioxide, another dielectric material, or any combination of the foregoing. In various embodiments, the ferroelectric layer 126 may, for example, be or comprise hafnium zirconium oxide (HfZrO), hafnium oxide doped with silicon (HfZrO), aluminum oxide ($Al_2O_3$), titanium oxide ($TiO_2$), lanthanum oxide ($La_2O_3$), barium strontium titanium oxide ($BaSrTiO_4$), lead zirconate titanate (PZT), other suitable ferroelectric material(s), or any combination of the foregoing. Thus, in some embodiments, the gate dielectric layer 212 and the bottom gate dielectric layer 232 may comprise a dielectric material different from that of the ferroelectric layer 126.

Figure 3:
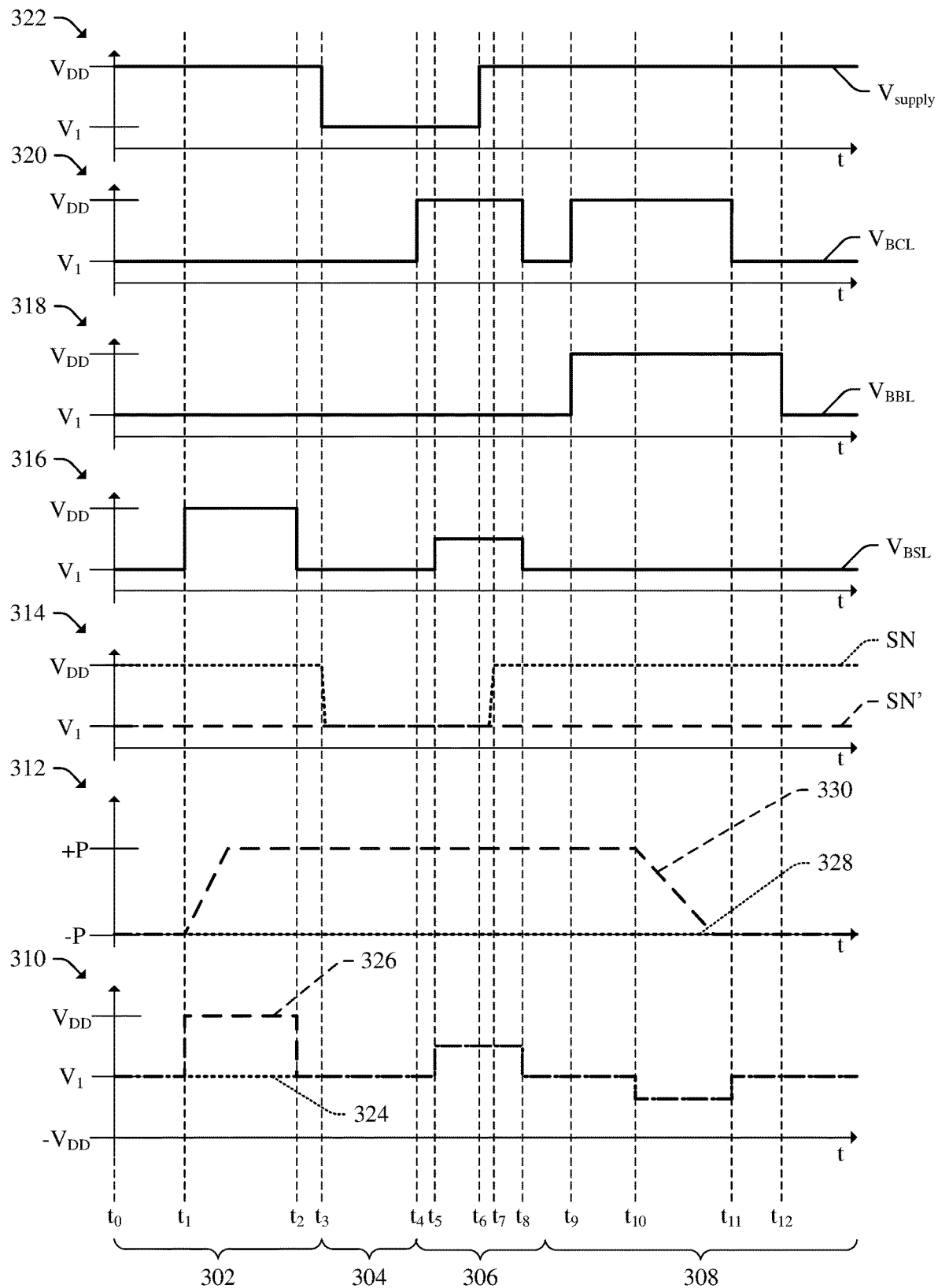
FIG. 3 illustrates a timing diagram of some embodiments of operation of the memory device comprising the data backup unit from FIG. 1 or 2.

FIG. 3 illustrates a timing diagram of some embodiments of operating the memory device 100 of FIG. 1 and/or the data backup unit 108 of FIG. 2. The timing diagram of FIG. 3 provides one example of operating conditions applied to the memory device and/or data backup unit. However, it should be appreciated that other operating conditions are amenable, whereby the timing diagram of FIG. 3 is merely an example.

A first graph 310 illustrates a first voltage 324 across the ferroelectric layer (126 of FIGS. 1 and/or 2) of the first ferroelectric memory element (122 of FIGS. 1 and/or 2) and a second voltage 326 across the ferroelectric layer (126 of FIGS. 1 and/or 2) of the second ferroelectric memory element (124 of FIGS. 1 and/or 2). A second graph 312 illustrates a first polarization 328 of the ferroelectric layer (126 of FIGS. 1 and/or 2) of the first ferroelectric memory element (122 of FIGS. 1 and/or 2) and a second polarization 330 of the ferroelectric layer (126 of FIGS. 1 and/or 2) of the second ferroelectric memory element (124 of FIGS. 1 and/or 2). A third graph 314 illustrates voltages at the first data storage node (SN of FIGS. 1 and/or 2) and the second data storage node (SN' of FIGS. 1 and/or 2). A fourth graph 316 illustrates a backup select line voltage signal $V_{BSL}$ applied to the backup select line (BSL of FIGS. 1 and/or 2). A fifth graph 318 illustrates a backup bit line voltage signal $V_{BBL}$ applied to the backup bit line (BBL of FIGS. 1 and/or 2). A sixth graph 320 illustrates a backup control line voltage signal $V_{BCL}$ applied to the backup control line (BCL of FIGS. 1 and/or 2). A seventh graph 322 illustrates a power supply voltage signal $V_{supply}$ applied to the first power supply (109 of FIG. 1). In various embodiments, when referring to the graphs of FIG. 3, a low voltage $V_1$ is about 0 volts, and a high voltage $V_{DD}$ may, for example, be about 0.7 volts, 1.8 volts, 5 volts, 12 volts, or some other suitable voltage value. In yet further embodiments, the first and second ferroelectric memory elements (122, 124 of FIGS. 1 and/or 2) are both initialized to have a high threshold voltage. In various embodiments, the high threshold voltage is greater than $V_{DD}/2$.

In some embodiments, during a data storage operation 302 (e.g., between an initial time t0 and immediately before a third time $t_3$), data from the data storage element (102 of FIG. 1) of the memory cell (101 of FIG. 1) is written, saved, or stored to the data backup unit (108 of FIGS. 1 and/or 2). At the initial time t0, the first storage node SN of the data storage element (102 of FIG. 1) has a high voltage and the second storage node SN' of the data storage element (102 of FIG. 1) has a low voltage. Further, the ferroelectric layers (126 of FIGS. 1 and/or 2) of the first and second ferroelectric memory elements (122, 124 of FIGS. 1 and/or 2) have a negative polarity, and the power supply voltage signal $V_{supply}$ is high such that the memory cell (101 of FIG. 1) is powered on.

At a first time $t_1$, the backup select line voltage signal $V_{BSL}$ is raised high (e.g., set to the high voltage $V_{DD}$), such that the first voltage 324 remains low (e.g., because the first storage node SN and the backup select line voltage signal $V_{BSL}$ are both high) and the second voltage 326 goes high (e.g., because the second storage node SN' is low and the backup select line voltage signal $V_{BSL}$ is high), thereby erasing the second ferroelectric memory element (124 of FIGS. 1 and/or 2) such that the second ferroelectric memory element (124 of FIGS. 1 and/or 2) has a low threshold voltage (e.g., less than $V_{DD}/2$). Accordingly, a data state of the data storage element (102 of FIG. 1) is stored in the data backup unit (108 of FIGS. 1 and/or 2), where the ferroelectric layer (126 of FIGS. 1 and/or 2) of the first ferroelectric memory element (122 of FIGS. 1 and/or 2) has a negative polarity and the ferroelectric layer (126 of FIGS. 1 and/or 2) of the second ferroelectric memory element (124 of FIGS. 1 and/or 2) has a positive polarity. Thus, in some embodiments, after performing the data storage operation 302, the second ferroelectric memory element (124 of FIGS. 1 and/or 2) has the low threshold voltage less than a high threshold voltage of the first ferroelectric memory element (122 of FIGS. 1 and/or 2). Further, at a second time $t_2$, the backup select line voltage signal $V_{BSL}$ goes low.

In some embodiments, during a power off operation 304 (e.g., between the third time $t_3$ and a fourth time $t_4$), power is removed from the memory cell (101 of FIG. 1) such that the data state of the data storage element (102 of FIG. 1) is lost. At the third time $t_3$, the power supply voltage signal $V_{supply}$ goes low (e.g., is taken to about 0 volts), such that power is removed from the memory cell (101 of FIG. 1) and both the first and second data storage nodes SN, SN' go low. In various embodiments, the ferroelectric layers (126 of FIGS. 1 and/or 2) of the first and second ferroelectric memory elements (122, 124 of FIGS. 1 and/or 2) store the data state of the memory cell (101 of FIG. 1) during/after the power off operation 304.

In various embodiments, during a data restore operation 306 (e.g., between the fourth time $t_4$ and a ninth time $t_9$), the data backup unit (108 of FIGS. 1 and/or 2) is powered on before returning power to the memory cell (101 of FIG. 1) and the data state of the memory cell (101 of FIG. 1) is restored to the data storage element (102 of FIG. 1). At the fourth time $t_4$, the backup control line voltage signal $V_{BCL}$ goes high. In various embodiments, the backup bit line voltage signal $V_{BBL}$ is grounded at the fourth time $t_4$. At a fifth time $t_5$, the backup select line voltage signal $V_{BSL}$ goes to a moderately high voltage (e.g., $V_{DD}/2$), such that the second ferroelectric memory element (124 of FIGS. 1 and/or 2) is on (e.g., due to the low threshold voltage) and the first ferroelectric memory element (122 of FIGS. 1 and/or 2) is off (e.g., due to the high threshold voltage). In various embodiments, the moderately high voltage is greater than the low threshold voltage of the second ferroelectric memory element (124 of FIGS. 1 and/or 2) and less than the high threshold voltage of the first ferroelectric memory element (122 of FIGS. 1 and/or 2). In various embodiments, at the fifth time is the first and second voltages 324, 326 at the moderately high voltage (e.g., $V_{DD}/2$). At a sixth time $t_6$, the power supply voltage signal $V_{supply}$ goes high, thereby turning the memory cell (101 of FIG. 1) on. At a seventh time $t_7$, the first data storage node SN goes high and the second data storage node SN' remains low as the data backup unit (108 of FIGS. 1 and/or 2) restores the saved data state to the memory cell (101 of FIG. 1). In various embodiments, at the seventh time $t_7$ due to the second ferroelectric memory element (124 of FIGS. 1 and/or 2) being on, the second data storage node SN' is pulled down low (e.g., to ground) and the first data storage node SN is raised high (e.g., to $V_{DD}$). At an eighth time $t_8$, the backup control line voltage signal $V_{BCL}$ and the backup select line voltage signal $V_{BSL}$ go low.

In some embodiments, during a data clear operation 308 (e.g., between the eighth time $t_8$ and a twelfth time $t_{12}$) data within the data backup unit (108 of FIGS. 1 and/or 2) is cleared, where the first and second ferroelectric memory elements (122, 124 of FIGS. 1 and/or 2) are programmed to have the high threshold voltage. At the ninth time $t_9$, the backup bit line voltage signal $V_{BBL}$ and the backup control line voltage signal $V_{BCL}$ both go high. At a tenth time $t_{10}$, sometime after the backup bit line voltage signal $V_{BBL}$ and the backup control line voltage signal $V_{BCL}$ go high, the polarization of ferroelectric layer (126 of FIGS. 1 and/or 2) of the second ferroelectric memory element (124 of FIGS. 1 and/or 2) transitions from the positive polarity to the negative polarity. Between the tenth time $t_{10}$ and an eleventh time $t_{11}$, the first and second voltages 324, 326 across the ferroelectric layers (126 of FIGS. 1 and/or 2) of the first and second ferroelectric memory elements (122, 124 of FIGS. 1 and/or 2) may be negative and is equal to a difference between a threshold voltage (e.g., the high threshold voltage) of the first and second ferroelectric memory elements (122, 124 of FIGS. 1 and/or 2) and the high voltage $V_{DD}$. At the eleventh time $t_{11}$, the backup control line voltage signal $V_{BCL}$ goes low. At the twelfth time $t_{12}$, the backup bit line voltage signal $V_{BBL}$ goes low. In various embodiments, while performing the data clear operation 308 on the data backup unit (108 of FIGS. 1 and/or 2), the memory cell (101 of FIG. 1) may perform normal SRAM operations (e.g., read and/or write operations), such that the data clear operation 308 and the SRAM operations may be performed concurrently with one another.

In yet further embodiments, a programming operation may be performed on the first and second ferroelectric memory elements (122, 124 of FIGS. 1 and/or 2) before performing the data storage operation 302, such that the first and second ferroelectric memory elements (122, 124 of FIGS. 1 and/or 2) are set to an initial threshold voltage (e.g., the high threshold voltage).

Figure 4A:
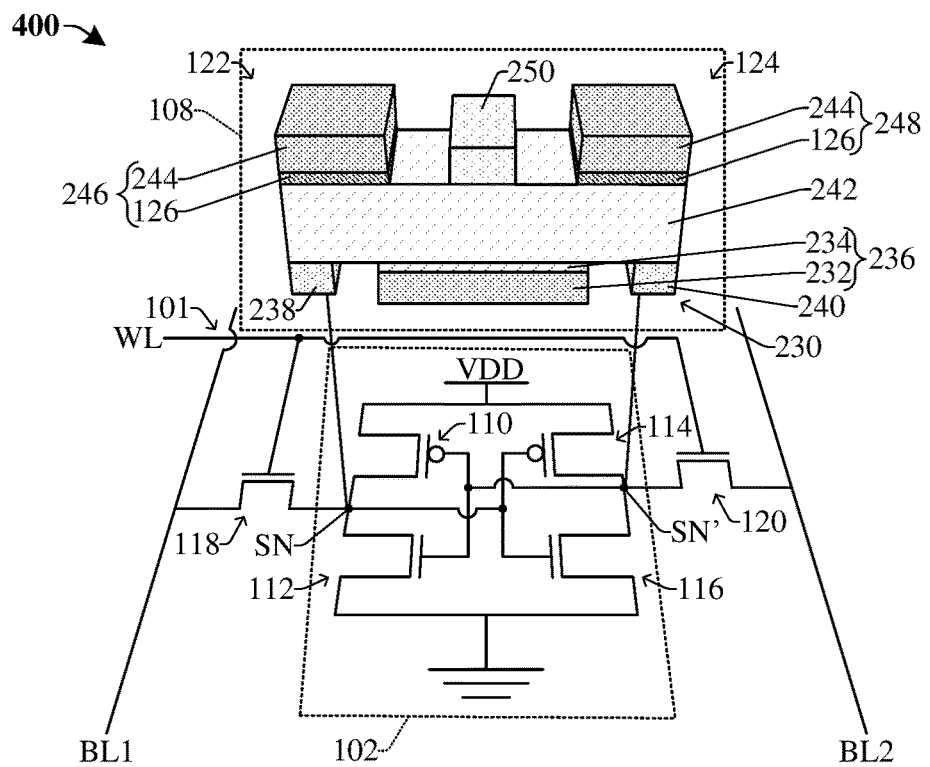
FIGS. 4A and 4B illustrate diagrams of various embodiments of a memory device comprising the memory cell and a data backup unit overlying the memory cell.

FIG. 4A illustrates a diagram of some embodiments of a memory device 400 comprising the memory cell 101 and a data backup unit 108, where FIG. 4A includes a perspective view of the data backup unit 108 and a circuit diagram of the memory cell 101.

The memory cell 101 comprises the data storage element 102 having the first, second, third, and fourth transistors 110, 112, 114, 116, the first access transistor 118, and the second access transistor 120. Further, the data backup unit 108 comprises the first, second, and third source/drain structures 238, 240, 250, the bottom gate structure 236, the channel layer 242, the first memory gate structure 246, and the second memory gate structure 248. In various embodiments, the first, second, third, and fourth transistors 110, 112, 114, 116, the first access transistor 118, and the second access transistor 120 are disposed within a FEOL structure (e.g., 202 of FIG. 2) and the data backup unit 108 is disposed within a BEOL structure (e.g., 204 of FIG. 2), thereby decreasing a lateral footprint of the memory device 400 and increasing a device density. The structures and/or layers of the data backup unit 108 are vertically stacked, for example, the first and second source/drain structures 238, 240 underlie the channel layer 242, and the third source/drain structure 250 and first and second memory gate structures 246, 248 are disposed over the channel layer 242.

Figure 4B:
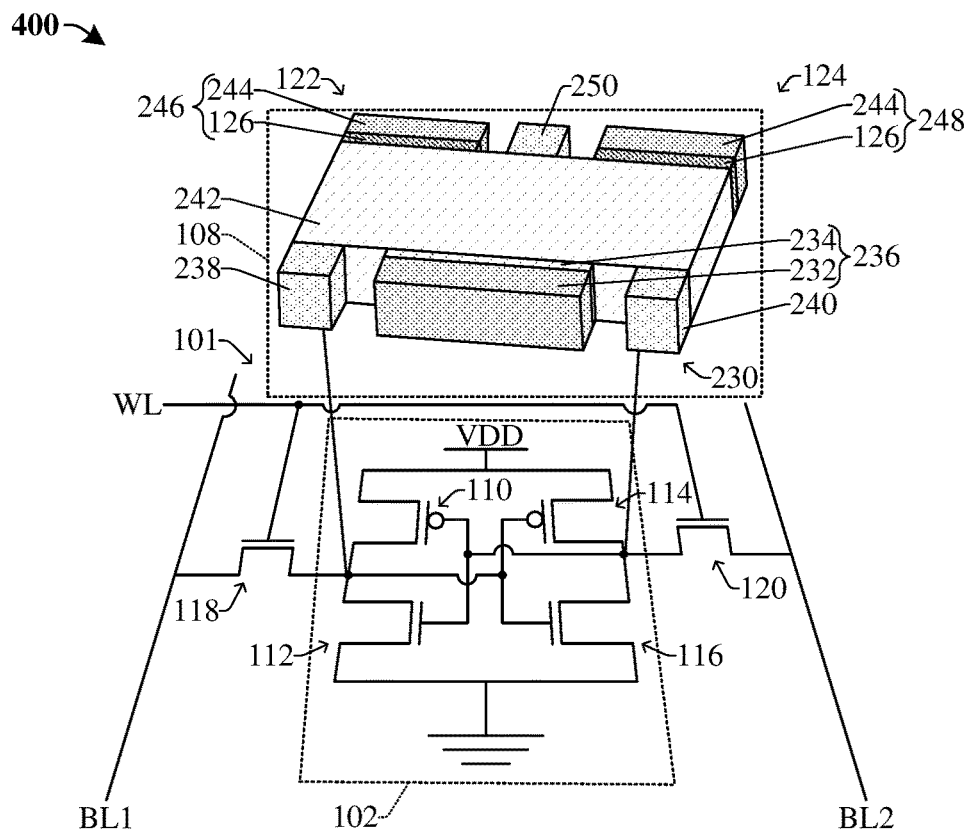

FIG. 4B illustrates a diagram of some other embodiments of the memory device 400 of FIG. 4A, in which the data backup unit 108 is rotated 90 degrees such that the structures and/or layers of the data backup unit 108 are disposed along and each have a bottom surface contacting a single horizontal plane. In such embodiments, top surfaces of the first, second, and third source/drain structures 238, 240, 250, a top surface of the bottom gate structure 236, a top surface of the channel layer 242, and top surfaces of the first and second memory gate structure 246, 248 are vertically aligned and/or co-planar.

Figure 5:
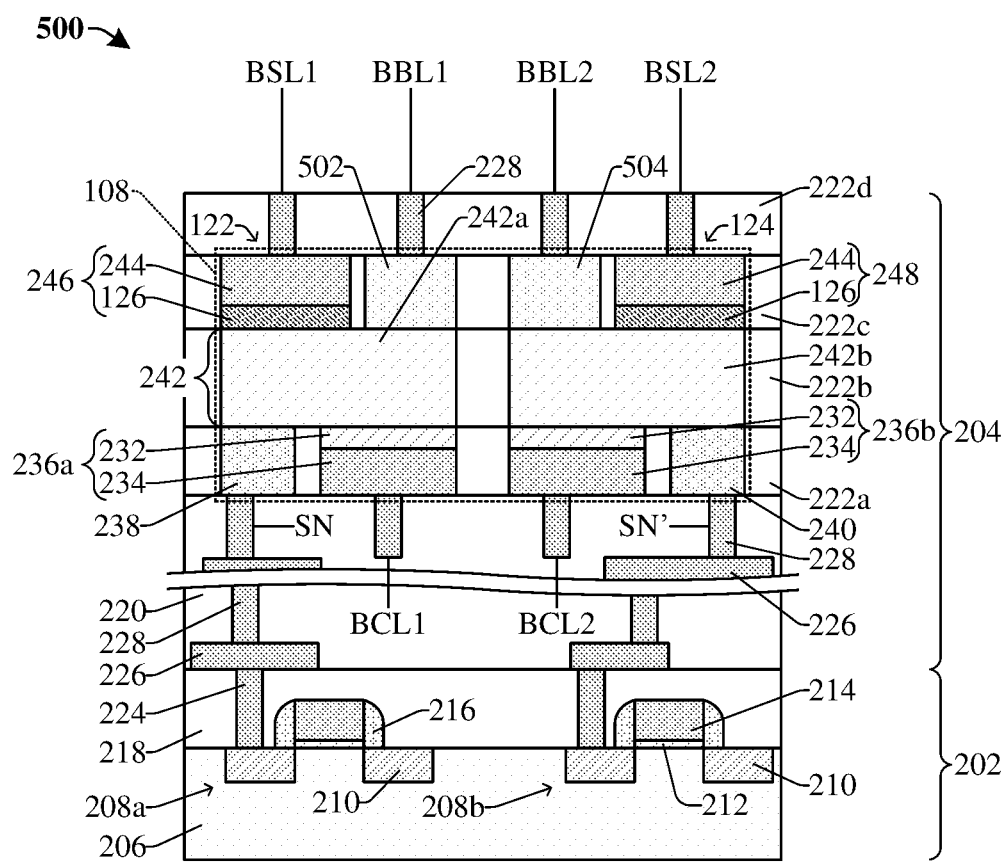
FIG. 5 illustrates a cross-sectional view of some other embodiments of the memory device of FIG. 2.

FIG. 5 illustrates a cross-sectional view of some embodiments of a memory device 500 corresponding to some alternative embodiments of the memory device 200 of FIG. 2, in which the channel layer 242 comprises a first channel structure 242a laterally offset from a second channel structure 242b. In such embodiments, the data backup unit 108 further comprises a first upper source/drain structure 502, a second upper source/drain structure 504, a first bottom gate structure 236a, and a second bottom gate structure 236b.

In some embodiments, the second dielectric layer 222b continuously laterally extends from a sidewall of the first channel structure 242a to a sidewall of the second channel structure 242b. The first bottom gate structure 236a is disposed along and contacts a bottom surface of the first channel structure 242a. The first upper source/drain structure 502 is disposed along and contacts a top surface of the first channel structure 242a. The first channel structure 242a, the first upper source/drain structure 502, and the first bottom gate structure 236a are parts of the first ferroelectric memory element 122. Further, the second bottom gate structure 236b is disposed along and contacts a bottom surface of the second channel structure 242b. The second upper source/drain structure 504 is disposed along and contacts a top surface of the second channel structure 242b. The second channel structure 242b, the second upper source/drain structure 504, and the second bottom gate structure 236b are parts of the second ferroelectric memory element 124.

The second dielectric layer 222b isolates a selectively conductive channel region in the first channel structure 242a from a selectively conductive channel region in the second channel structure 242b, thereby increasing isolation between the first and second ferroelectric memory elements 122, 124. In various embodiments, by virtue of the channel layer 242 comprising the first and second channel structures 242a, 242b, the clear operation may only be performed on the ferroelectric memory element that has a low threshold voltage. For example, in regards to the timing diagram illustrated and/or described in FIG. 3, after performing the data restore operation (306 of FIG. 3) the data clear operation (308 of FIG. 3) may be performed on the second ferroelectric memory element 124 to reset the second ferroelectric memory element 124 to the high threshold voltage while the first ferroelectric memory element 122 is not reset because it already has the high threshold voltage. In various embodiments, the first bottom gate structure 236a is electrically coupled to a first backup control line BCL1, the first memory gate structure 246 is electrically coupled to a first backup source line BSL1, and the first upper source/drain structure 502 is electrically coupled to a first backup bit line BBL1. Further, the second bottom gate structure 236b is electrically coupled to a second backup control line BCL2, the second memory gate structure 248 is electrically coupled to a second backup source line BSL2, and the second upper source/drain structure 504 is electrically coupled to a second backup bit line BBL2.

Figure 6:
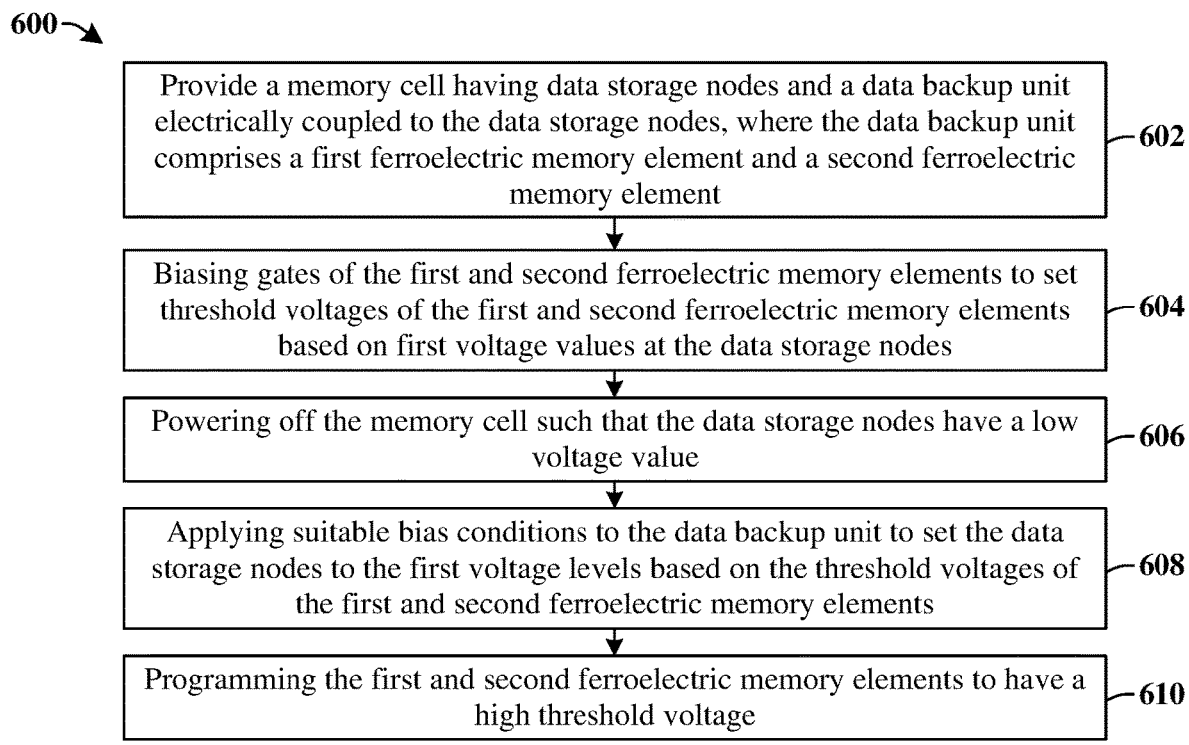
FIG. 6 illustrates a block diagram of some embodiments of a method of using a memory device comprising a memory cell and a data backup unit.

FIG. 6 illustrates a block diagram of a method 600 for operating a memory device comprising a memory cell and a data backup unit. While the method 600 is illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or examples of the description herein. Further, one or more of the acts depicted herein may be carried out in one or more separate acts and/or phases.

At act 602, a memory cell having data storage nodes and a data backup unit are provided, where the data backup unit is electrically coupled to the data storage nodes and comprises a first ferroelectric memory element and a second ferroelectric memory element. FIG. 1 illustrates a circuit diagram corresponding to some embodiments of act 602.

At act 604, gates of the first and second ferroelectric memory elements are biased to set threshold voltages of the first and second ferroelectric memory elements based on first voltage values at the data storage nodes. FIGS. 1 and 2 illustrate a circuit diagram and graphs 310-322 corresponding to some embodiments of act 604.

At act 606, the memory cell is powered off such that the data storage nodes have a low voltage value. FIGS. 1 and 2 illustrate a circuit diagram and graphs 310-322 corresponding to some embodiments of act 606.

At act 608, suitable bias conditions are applied to the data backup unit to set the data storage nodes to the first voltage levels based on the threshold voltages of the first and second ferroelectric memory elements. FIGS. 1 and 2 illustrate a circuit diagram and graphs 310-322 corresponding to some embodiments of act 608.

At act 610, the first and second ferroelectric memory elements are programmed to have a high threshold voltage. FIGS. 1 and 2 illustrate a circuit diagram and graphs 310-322 corresponding to some embodiments of act 610.

FIGS. 7-19 illustrate cross-sectional views of some embodiments of a method for forming a data backup unit disposed within a BEOL structure according to the present disclosure. Although the various views shown in FIGS. 7-19 are described with reference to a method, it will be appreciated that the structures shown in FIGS. 7-19 are not limited to the method but rather may stand alone separate of the method. Furthermore, although FIGS. 7-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
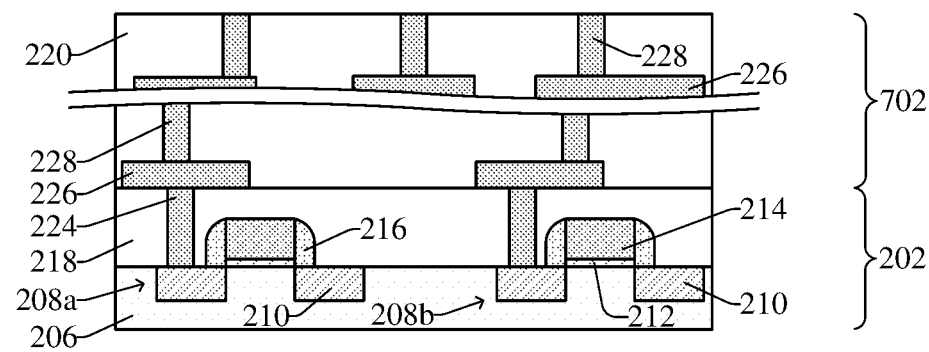
FIGS. 7-19 illustrate cross-sectional views of some embodiments of a method for forming a data backup unit disposed within a back-end of line (BEOL) structure.

As shown in the cross-sectional view 700 of FIG. 7, a substrate 206 is provided and a FEOL structure 202 and lower BEOL structure 702 are formed on the substrate 206. In various embodiments, the substrate 206 may, for example, be or comprise silicon, monocrystalline silicon, CMOS bulk, a silicon-on-insulator (SOI) substrate, silicon-germanium (SiGe), or another suitable semiconductor material. Further, the FEOL structure 202 is formed within/on the substrate 206. The FEOL structure 202 comprises a plurality of semiconductor devices 208a-b disposed within/on the substrate 206, an ILD layer 218 overlying the substrate 206, and a plurality of conductive contacts 224 disposed within the ILD layer 218. The lower BEOL structure 702 is formed over the FEOL structure 202 and comprises a lower IMD structure 220, a plurality of conductive wires 226, and a plurality of conductive vias 228. In various embodiments, the FEOL structure 202 and the lower BEOL structure 702 may be formed by one or more deposition process(es), one or more patterning process(es), one or more planarization process(es), one or more ion implantation process(es), or some other suitable process(es). In yet further embodiments, the semiconductor devices 208a-b are part of a memory cell (e.g., 101 of FIGS. 1 and/or 2) such as a SRAM cell.

Figure 8:
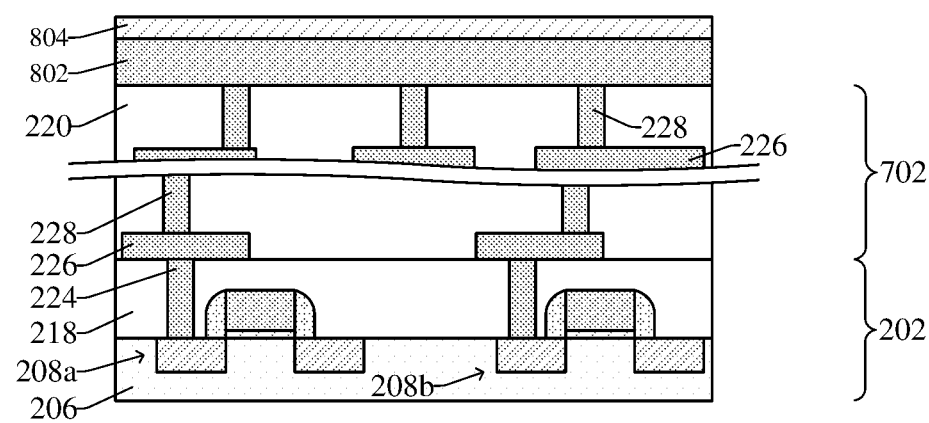

As shown in the cross-sectional view 800 of FIG. 8, a bottom gate electrode layer 802 is deposited on the lower IMD structure 220 and a bottom gate dielectric material 804 is deposited on the bottom gate electrode layer 802. In various embodiments, the bottom gate electrode layer 802 is deposited on the lower IMD structure 220 by, for example, chemical vapor deposition (CVD), physical vapor deposition (PVD), atomic layer deposition (ALD), electroplating, electroless plating, or some other suitable growth or deposition process. The bottom gate electrode layer 802 may, for example, be or comprise titanium, titanium nitride, tantalum, tantalum nitride, tungsten, tungsten nitride, aluminum, polysilicon, doped polysilicon, other suitable conductive material(s), or any combination of the foregoing. In some embodiments, the bottom gate dielectric material 804 is deposited on the bottom gate electrode layer 802 by, for example, CVD, PVD, ALD, or some other suitable growth or deposition process. The bottom gate dielectric material 804 may, for example, be or comprise silicon dioxide, a high-k dielectric material (e.g., a dielectric material with a dielectric constant greater than about 3.9), hafnium dioxide, zirconium dioxide, another dielectric material, or any combination of the foregoing.

Figure 9:
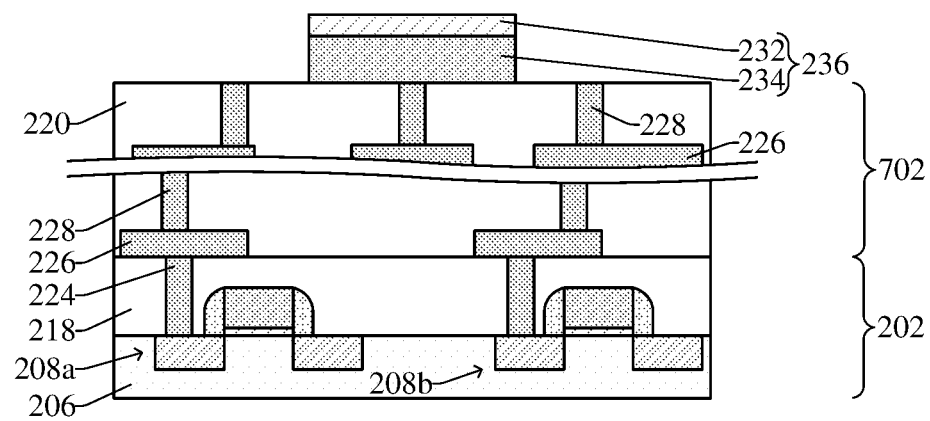

As shown in the cross-sectional view 900 of FIG. 9, a patterning process is performed on the bottom gate electrode layer (802 of FIG. 8) and the bottom gate dielectric material (804 of FIG. 8), thereby forming a bottom gate structure 236. The bottom gate structure 236 comprises a bottom gate dielectric layer 232 overlying a bottom gate electrode 234. In various embodiments, the patterning process comprises: forming a masking layer (not shown) over the bottom gate dielectric material (804 of FIG. 8); performing an etching process (e.g., a wet etch process and/or a dry etch process) on the bottom gate dielectric material (804 of FIG. 8) and the bottom gate electrode layer (802 of FIG. 8) according to the masking layer; and performing a removal process to remove the masking layer.

Figure 10:
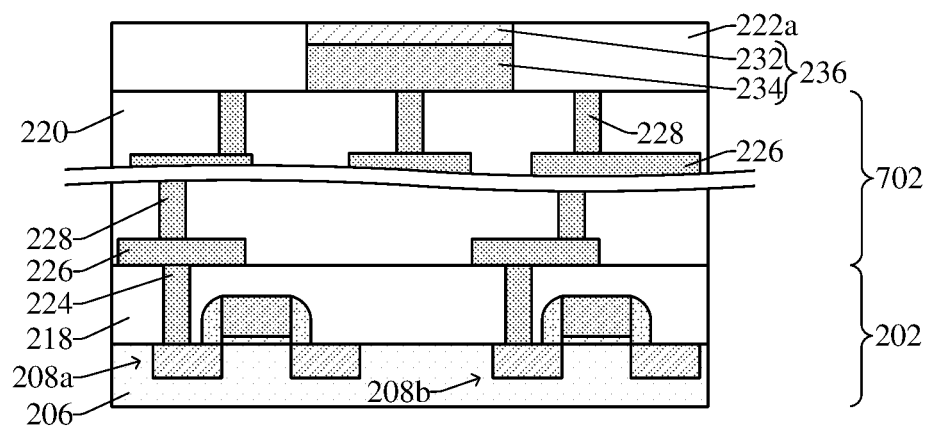

As shown in the cross-sectional view 1000 of FIG. 10, a first dielectric layer 222a is formed over the lower IMD structure 220 and around the bottom gate structure 236. In various embodiments, the first dielectric layer 222a may be formed on the lower IMD structure 220 by, for example, CVD, PVD, ALD, or some other suitable growth or deposition process. In some embodiments, a planarization process (e.g., a chemical mechanical planarization (CMP) process) is performed on the first dielectric layer 222a, such that a top surface of the first dielectric layer 222a is co-planar with a top surface of the bottom gate structure 236.

Figure 11:
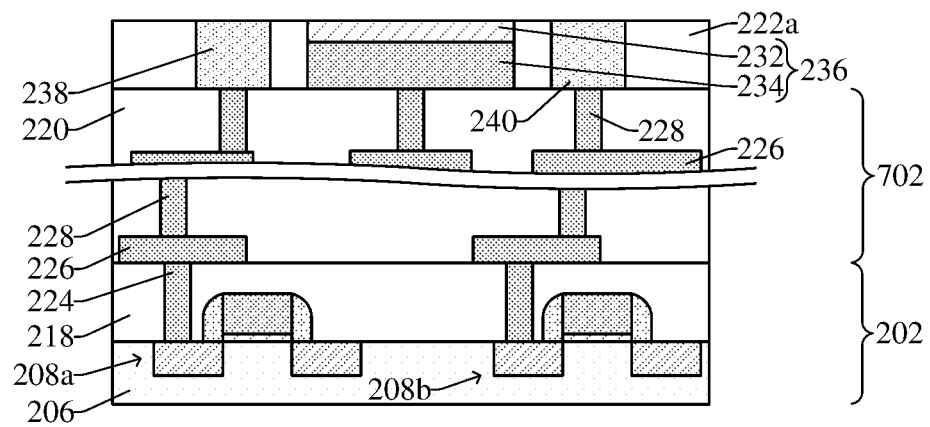

As shown in the cross-sectional view 1100 of FIG. 11, a first source/drain structure 238 and a second source/drain structure 240 are formed within the first dielectric layer 222a on opposing sides of the bottom gate structure 236. In various embodiments, a process for forming the first and second source/drain structures 238, 240 may comprise: patterning the first dielectric layer 222a to form openings in the first dielectric layer 222a on opposing sides of the bottom gate structure 236; depositing (e.g., by CVD, PVD, ALD, electro plating, electroless plating, etc.) a conductive material in the openings; and performing a planarization process (e.g., a CMP process) on the conductive material. In some embodiments, top surfaces of the first and second source/drain structures 238, 240 are co-planar with the top surface of the first dielectric layer 222a. The first and second source/drain structures 238, 240 may, for example, be or comprise titanium, titanium nitride, tungsten, tungsten nitride, tantalum, tantalum nitride, platinum, gold, another conductive material, or any combination of the foregoing.

Figure 12:
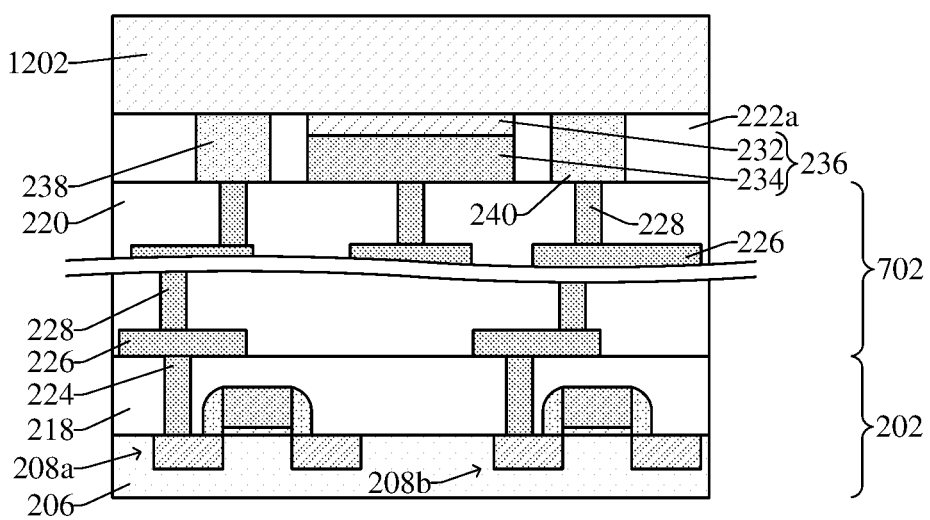

As shown in the cross-sectional view 1200 of FIG. 12, a channel structure 1202 is deposited over the first dielectric layer 222a and the bottom gate structure 236. In various embodiments, the channel structure 1202 is deposited on the first dielectric 222a by, for example, ALD, CVD, PVD, some other suitable deposition or growth process, or any combination of the foregoing. The channel structure 1202 may, for example, be or comprise indium zinc oxide (InZnO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), zinc oxide doped with aluminum (AZO), indium tungsten oxide (IWO), titanium oxide, a group III-V semiconductor material, a stack of layers comprising any of the aforementioned materials, an alloy, another suitable material, or any combination of the foregoing.

Figure 13:
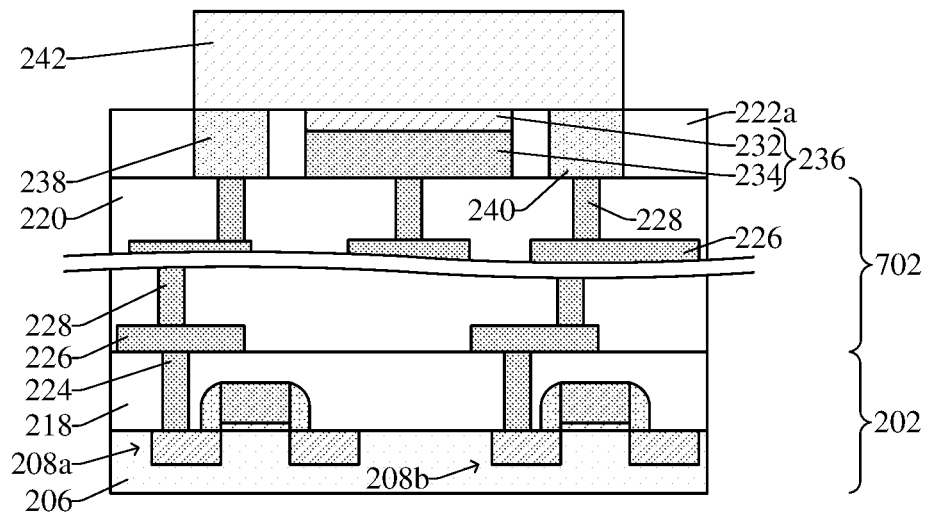

As shown in the cross-sectional view 1300 of FIG. 13, a patterning process is performed on the channel structure (1202 of FIG. 12) to form a channel layer 242 over the bottom gate structure 236 and the first and second source/drain structures 238, 240. In various embodiments, the patterning process includes performing a wet etch process and/or a dry etch process on the channel structure (1202 of FIG. 12) according to a masking layer (not shown).

Figure 14:
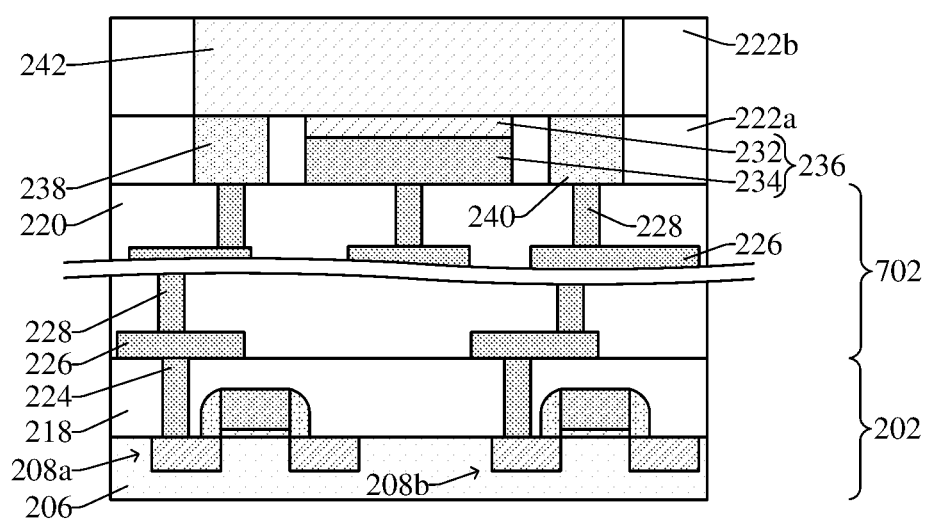

As shown in the cross-sectional view 1400 of FIG. 14, a second dielectric layer 222b is formed over the first dielectric layer 222a and around the channel layer 242. In various embodiments, the second dielectric layer 222b may be formed on the first dielectric layer 222a by, for example, CVD, PVD, ALD, or some other suitable growth or deposition process. In further embodiments, a planarization process (e.g., a CMP process) is performed on the second dielectric layer 222b, such that a top surface of the second dielectric layer 222b is co-planar with a top surface of the channel layer 242.

Figure 15:
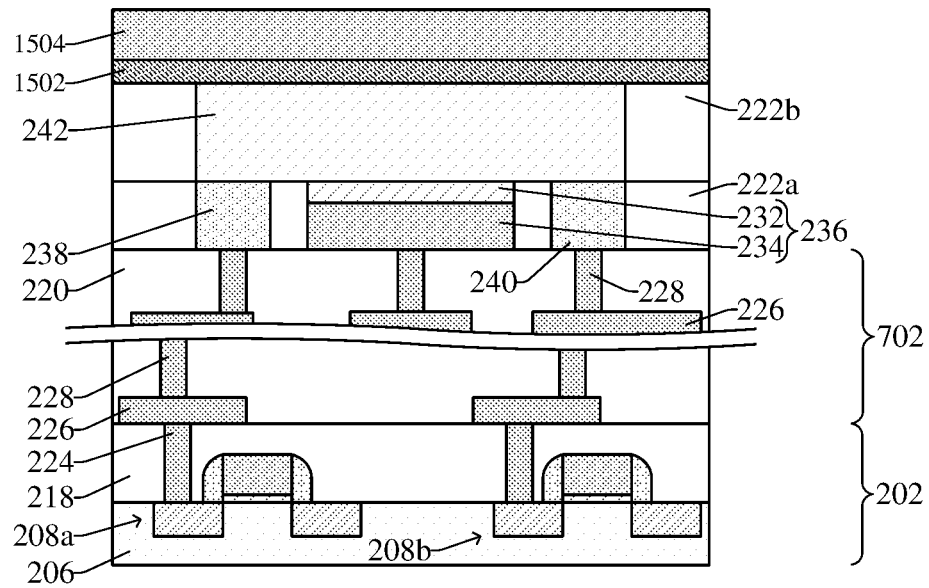

As shown in the cross-sectional view 1500 of FIG. 15, a ferroelectric structure 1502 is deposited on the channel layer 242 and an upper gate electrode layer 1504 is deposited on the ferroelectric structure 1502. In various embodiments, the ferroelectric structure 1502 is deposited on the channel layer 242 and the second dielectric layer 222b by, for example, CVD, PVD, ALD, or some other suitable growth or deposition process. The ferroelectric structure 1502 may, for example, be or comprise hafnium zirconium oxide (HfZrO), hafnium oxide doped with silicon (HfZrO), aluminum oxide ($Al_2O_3$), titanium oxide ($TiO_2$), lanthanum oxide ($La_2O_3$), barium strontium titanium oxide ($BaSrTiO_4$), lead zirconate titanate (PZT), other suitable ferroelectric material(s), or any combination of the foregoing. In some embodiments, the upper gate electrode layer 1504 is deposited on the ferroelectric structure 1502 by, for example, CVD, PVD, ALD, electro plating, electroless plating, or some other suitable growth or deposition process. The upper gate electrode layer 1504 may, for example, be or comprise titanium, titanium nitride, tantalum, tantalum nitride, tungsten, tungsten nitride, aluminum, polysilicon, doped polysilicon, other suitable conductive material(s), or any combination of the foregoing.

Figure 16:
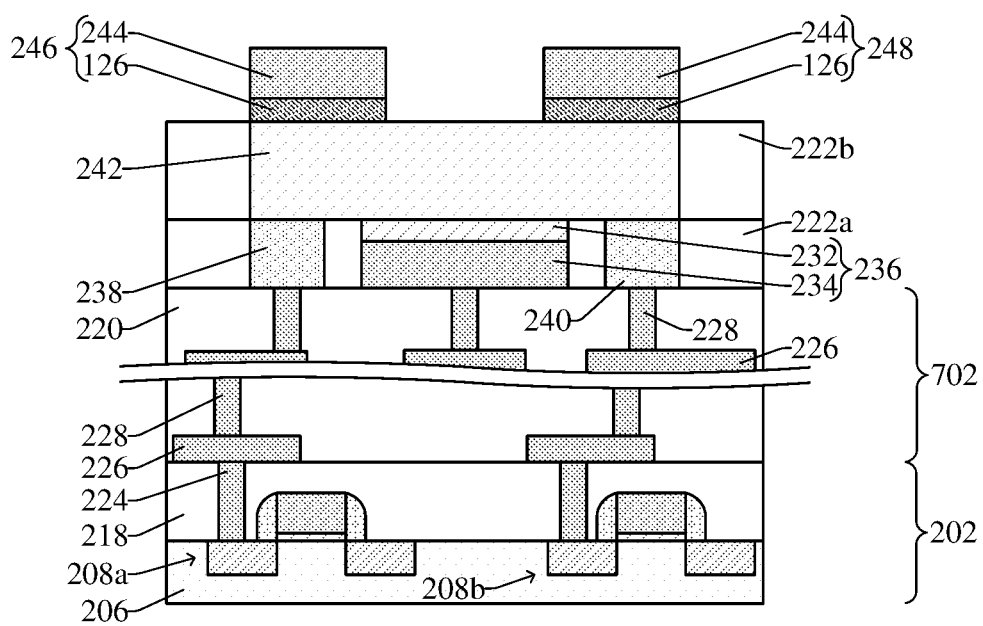

As shown in the cross-sectional view 1600 of FIG. 16, a patterning process is performed on the ferroelectric structure (1502 of FIG. 15) and the upper gate electrode layer (1504 of FIG. 15), thereby forming a first memory gate structure 246 and a second memory gate structure 248. The first and second memory gate structures 246, 248 comprise a ferroelectric layer 126 contacting the channel layer 242 and an upper gate electrode 244 overlying the ferroelectric layer 126. In some embodiments, the patterning process comprises: forming a masking layer (not shown) over the upper gate electrode layer (1504 of FIG. 15); performing an etching process (e.g., a wet etch process and/or a dry etch process) on the ferroelectric structure (1502 of FIG. 15) and the upper gate electrode layer (1504 of FIG. 15) according to the masking layer; and performing a removal process to remove the masking layer.

Figure 17:
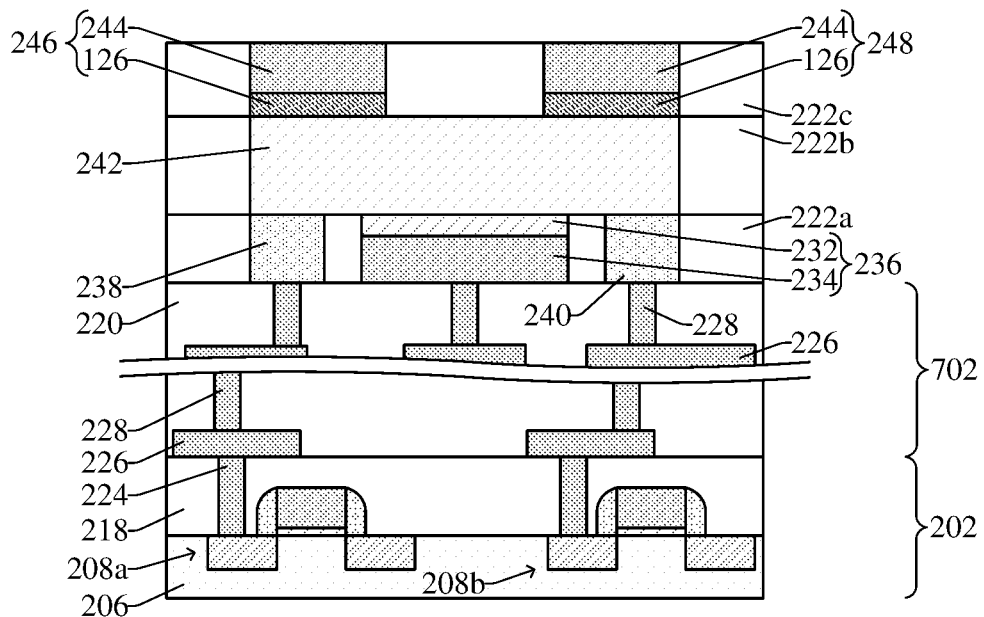

As shown in the cross-sectional view 1700 of FIG. 17, a third dielectric layer 222c is formed over the second dielectric layer 222b and around the channel layer 242. In some embodiments, the third dielectric layer 222c may be formed on the second dielectric layer 222b by, for example, CVD, PVD, ALD, or some other suitable growth or deposition process. In further embodiments, a planarization process (e.g., a CMP process) is performed on the third dielectric layer 222c, such that a top surface of the third dielectric layer 222c is co-planar with top surfaces of the first and second memory gate structures 246, 248.

Figure 18:
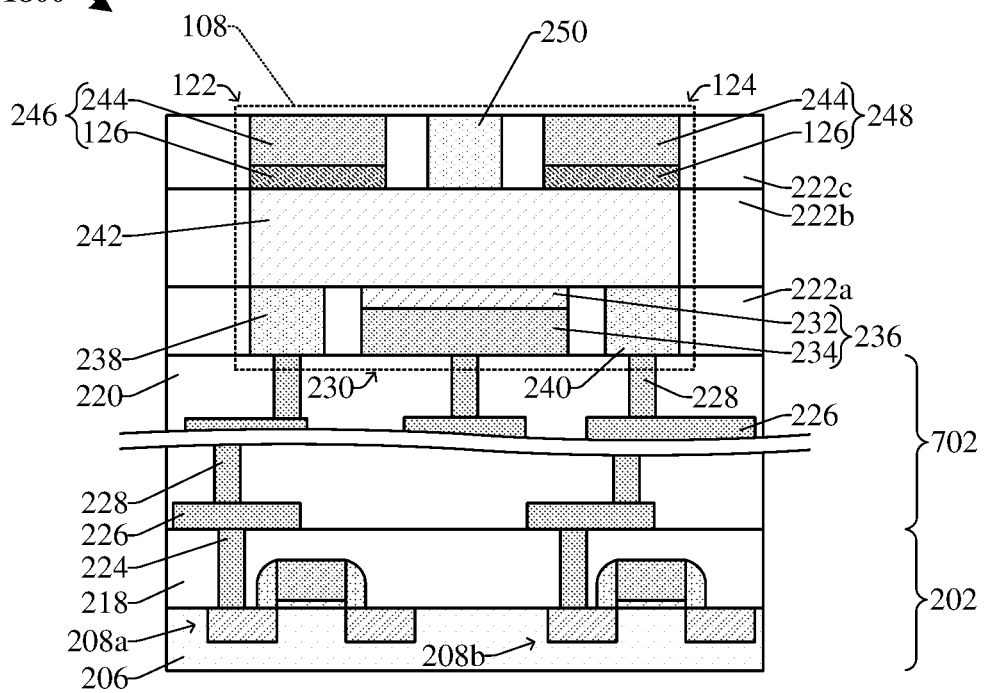

As shown in the cross-sectional view 1800 of FIG. 18, a third source/drain structure 250 is formed within the third dielectric layer 222c between the first memory gate structure 246 and the second memory gate structure 248, thereby forming a first ferroelectric memory element 122, a second ferroelectric memory element 124, and a control device 230. The first ferroelectric memory element 122, the second ferroelectric memory element 124, and the control device 230 are parts of a data backup unit 108. In some embodiments, a process for forming the third source/drain structure 250 may comprise: patterning the third dielectric layer 222c to form an opening in the third dielectric layer 222c between the first and second memory gate structures 246, 248; depositing (e.g., by CVD, PVD, ALD, electro plating, electroless plating, etc.) a conductive material in the opening; and performing a planarization process (e.g., a CMP process) on the conductive material. In some embodiments, a top surface of the third source/drain structure 250 is co-planar with the top surfaces of the first and second memory gate structures 246, 248 and the top surface of the third dielectric layer 222c.

Figure 19:
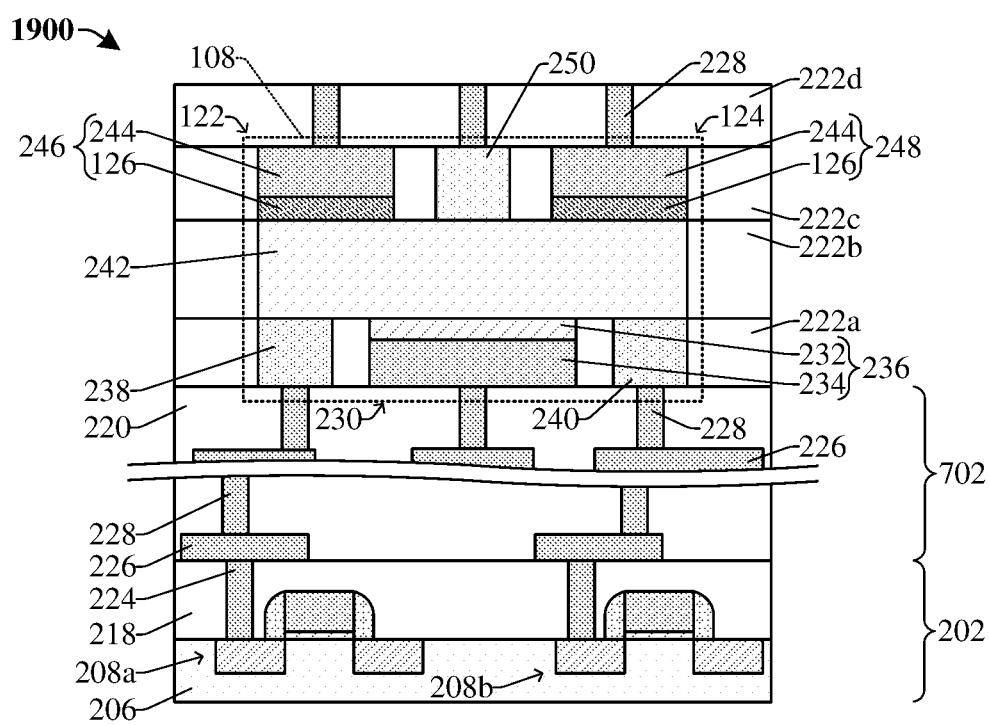

As shown in the cross-sectional view 1900 of FIG. 19, a fourth dielectric layer 222d is formed over the third dielectric layer 222c and conductive vias 228 are formed within the fourth dielectric layer 222d, thereby forming a BEOL structure 204 over the FEOL structure 202. In some embodiments, the fourth dielectric layer 222d is formed on the third dielectric layer 222c by, for example, CVD, PVD, ALD, or another suitable growth or deposition process. In further embodiments, the conductive vias 228 may be formed by one or more deposition process(es), one or more patterning process(es), one or more planarization process(es), or some other suitable process(es).

Figure 20:
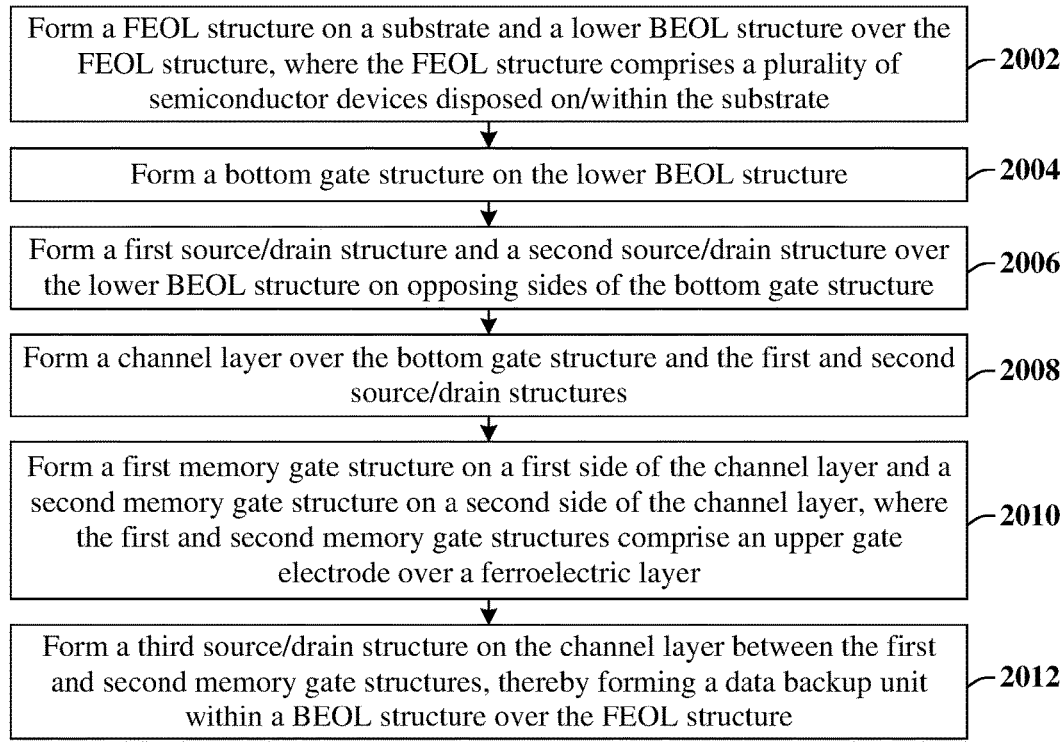
FIG. 20 illustrates a block diagram of some embodiments of a method for forming a data backup unit disposed within a BEOL structure.

FIG. 20 illustrates a block diagram of some embodiments of a method 2000 for forming a data backup unit disposed within a BEOL structure. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, a FEOL structure is formed on a substrate and a lower BEOL structure is formed over the FEOL structure. The FEOL structure comprises a plurality of semiconductor devices disposed on/within the substrate. FIG. 7 illustrates a cross-sectional view 700 corresponding to some embodiments of act 2002.

At act 2004, a bottom gate structure is formed on the lower BEOL structure. FIGS. 8 and 9 illustrate cross-sectional views 800 and 900 corresponding to some embodiments of act 2004.

At act 2006, a first source/drain structure and a second source/drain structure are formed over the lower BEOL structure on opposing sides of the bottom gate structure. FIG. 11 illustrates a cross-sectional view 1100 corresponding to some embodiments of act 2006.

At act 2008, a channel layer is formed over the bottom gate structure and the first and second source/drain structures. FIGS. 12 and 13 illustrates cross-sectional views 1200 and 1300 corresponding to some embodiments of act 2008.

At act 2010, a first memory gate structure is formed on a first side of the channel layer and a second memory gate structure is formed on a second side of the channel layer, where the first and second memory gate structures comprise an upper gate electrode over a ferroelectric layer. FIGS. 15 and 16 illustrate cross-sectional views 1500 and 1600 corresponding to some embodiments of act 2010.

At act 2012, a third source/drain structure is formed on the channel layer between the first and second memory gate structures, thereby forming a data backup unit within a BEOL structure over the FEOL structure. FIG. 18 illustrates a cross-sectional view 1800 corresponding to some embodiments of act 2012.

Accordingly, in some embodiments, the present application relates to a memory device comprising a data backup unit overlying a memory cell, where the data backup unit is configured to backup and restore a data state of the memory cell.

In some embodiments, the present application provides a memory device including: a memory cell comprising a plurality of semiconductor devices disposed on a substrate; a lower inter-metal dielectric (IMD) structure overlying the semiconductor devices; a plurality of conductive vias and a plurality of conductive wires disposed within the IMD structure and electrically coupled to the semiconductor devices; and a data backup unit overlying the plurality of conductive vias and wires, wherein the data backup unit comprises a first source/drain structure, a second source/drain structure, a channel layer, a first memory gate structure, and a second memory gate structure, wherein the first and second memory gate structures comprise an upper gate electrode over a ferroelectric layer, and wherein the first and second source/drain structures are directly electrically coupled to the semiconductor devices by way of the conductive vias and wires.

In some embodiments, the present application provides a memory device including: a memory cell arranged on a substrate, wherein the memory cell comprises: a latch circuit comprising two cross-coupled inverters; and a pass-gate transistor coupled between an output terminal of the latch circuit and a bit line; and a backup unit arranged in a dielectric structure over the memory cell, wherein the backup unit comprises: a first ferroelectric memory element coupled between the output terminal of the latch circuit and a backup bit line.

In some embodiments, the present application provides a method for forming a memory device, the method comprising: forming a plurality of semiconductor devices on a substrate; forming a lower inter-metal dielectric (IMD) structure over the plurality of semiconductor devices; forming a bottom gate structure over the IMD structure; forming a first source/drain structure and a second source/drain structure over the IMD structure and on opposing sides of the bottom gate structure; forming a channel layer over the bottom gate structure; and forming a first memory gate structure and a second memory gate structure over the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
   forming a plurality of semiconductor devices on a substrate;
   forming a lower inter-metal dielectric (IMD) structure over the plurality of semiconductor devices;
   forming a bottom gate structure over the IMD structure;
   forming a first source/drain structure and a second source/drain structure over the IMD structure and on opposing sides of the bottom gate structure;
   forming a channel layer over the bottom gate structure, wherein the channel layer continuously extends over top surfaces of the first and second source/drain structures and a top surface of the bottom gate structure; and
   forming a first memory gate structure and a second memory gate structure over the channel layer.

2. The method of claim 1, further comprising:
   forming a third source/drain structure over the channel layer and laterally between the first and second memory gate structures.

3. The method of claim 1, wherein forming the first and second memory gate structures comprises:
   depositing a ferroelectric structure on the channel layer;
   depositing a gate electrode layer on the ferroelectric structure; and
   patterning the ferroelectric structure and the gate electrode layer.

4. The method of claim 1, wherein the bottom gate structure continuously laterally extends from under a sidewall of the first memory gate structure to a sidewall of the second memory gate structure.

5. The method of claim 1, wherein the first source/drain structure directly underlies the first memory gate structure and the second source/drain structure directly underlies the second memory gate structure.

6. The method of claim 1, wherein the plurality of semiconductor devices comprise a first semiconductor device and second semiconductor device on the substrate, wherein a source/drain region of the first semiconductor device is coupled to the first source/drain structure and a source/drain region of the second semiconductor device is coupled to the second source/drain structure.

7. The method of claim 1, wherein forming the channel layer comprises:
   depositing a channel structure on the bottom gate structure and the first and second source/drain structures; and
   patterning the channel structure to define the channel layer, wherein the first and second source/drain structures are spaced between opposing sidewalls of the channel layer.

8. The method of claim 1, further comprising:
   forming a plurality of conductive interconnects in the lower IMD structure, wherein the plurality of conductive interconnects comprises a first conductive interconnect coupled to the first source/drain structure, a second conductive interconnect coupled to the bottom gate structure, and a third conductive interconnect coupled to the second source/drain structure.

9. The method of claim 1, wherein forming the bottom gate structure comprises:
   depositing a bottom gate electrode layer on the lower IMD structure;
   depositing a bottom gate dielectric material on the bottom gate electrode layer; and
   patterning the bottom gate electrode layer and the bottom gate dielectric material.

10. A method for forming a memory device, the method comprising:
    forming a plurality of semiconductor devices on a substrate;
    forming a lower inter-metal dielectric (IMD) structure over the plurality of semiconductor devices;
    forming a plurality of conductive interconnects in the lower IMD structure;
    forming a bottom gate structure over the IMD structure;
    forming a first source/drain structure and a second source/drain structure over the IMD structure and on opposing sides of the bottom gate structure, wherein the plurality of conductive interconnects comprises a first conductive interconnect coupled to the first source/drain structure, a second conductive interconnect coupled to the bottom gate structure, and a third conductive interconnect coupled to the second source/drain structure;
    forming a channel layer over the bottom gate structure, wherein the channel layer continuously extends over top surfaces of the first and second source/drain structures and a top surface of the bottom gate structure; and
    forming a first memory gate structure and a second memory gate structure over the channel layer.

11. The method of claim 10, wherein the first memory gate structure comprises a first data storage layer and a first conductive layer over the first data storage layer, wherein the second memory gate structure comprises a second data storage layer and a second conductive layer over the second data storage layer, wherein the first and second data storage layers directly contact a top surface of the channel layer.

12. The method of claim 10, wherein forming the first and second source/drain structures comprises:
    depositing a dielectric layer over the lower IMD structure and around the bottom gate structure;
    etching the dielectric layer to form a pair of openings in the dielectric layer, wherein the bottom gate structure is spaced between the pair of openings; and
    depositing a conductive material in the pair of openings.

13. The method of claim 10, further comprising:
    depositing a dielectric layer over the channel layer and around the first and second memory gate structures;

etching the dielectric layer to form an opening in the dielectric layer between the first and second memory gate structures; and depositing a conductive material in the opening.

14. The method of claim 10, wherein the channel layer comprises one or more of indium zinc oxide (InZnO), indium tin oxide (ITO), indium oxide (In$_2$O$_3$), gallium oxide (Ga$_2$O$_3$), indium gallium zinc oxide (InGaZnO), zinc oxide (ZnO), aluminum zinc oxide (Al$_2$O$_5$Zn$_2$), zinc oxide doped with aluminum (AZO), indium tungsten oxide (IWO), or titanium oxide.

15. A memory device, comprising:
a plurality of semiconductor devices on a substrate;
a lower inter-metal dielectric (IMD) structure over the plurality of semiconductor devices;
a bottom gate structure over the IMD structure;
a first source/drain structure and a second source/drain structure over the IMD structure and on opposing sides of the bottom gate structure;
a channel layer over the bottom gate structure, wherein the channel layer continuously extends over top surfaces of the first and second source/drain structures and a top surface of the bottom gate structure; and
a first memory gate structure and a second memory gate structure over the channel layer.

16. The memory device of claim 15, wherein the first memory gate structure comprises a first gate electrode and a first gate dielectric layer between the first gate electrode and the channel layer, wherein the bottom gate structure comprises a second gate electrode and a second gate dielectric layer between the second gate electrode and the channel layer, wherein a first material of the first gate dielectric layer is different from a second material of the second gate dielectric layer.

17. The memory device of claim 15, further comprising:
a third source/drain structure over the channel layer and spaced laterally between the first memory gate structure and the second memory gate structure.

18. The memory device of claim 17, wherein the third source/drain structure directly overlies the bottom gate structure.

19. The memory device of claim 17, wherein the plurality of semiconductor devices comprise two cross-coupled inverters and a pass-gate transistor, wherein the two cross-coupled inverters define a latch circuit, wherein the pass-gate transistor is coupled between an output terminal of the latch circuit and a bit line, wherein the first source/drain structure is coupled to the output terminal and the third source/drain structure is coupled to a backup bit line.

20. The memory device of claim 15, wherein the channel layer comprises a first surface opposite a second surface, wherein the first surface and the second surface are substantially parallel to one another and a top surface of the substrate, wherein the first source/drain structure, the second source/drain structure, and the bottom gate structure contact the first surface, wherein the first memory gate structure and the second memory gate structure contact the second surface.

* * * * *